(12) United States Patent
Lee

(10) Patent No.: US 11,751,390 B2
(45) Date of Patent: Sep. 5, 2023

(54) MANUFACTURING METHOD OF SEMICONDUCTOR DEVICE INCLUDING STEPPING STRUCTURE AND SUPPORTING STRUCTURE

(71) Applicant: SK hynix Inc., Icheon (KR)

(72) Inventor: Nam Jae Lee, Cheongju (KR)

(73) Assignee: SK hynix Inc., Icheon (KR)

( * ) Notice: Subject to any disclaimer, the term of this patent is extended or adjusted under 35 U.S.C. 154(b) by 84 days.

(21) Appl. No.: 17/373,409

(22) Filed: Jul. 12, 2021

(65) Prior Publication Data

US 2021/0343741 A1   Nov. 4, 2021

Related U.S. Application Data

(63) Continuation of application No. 16/552,905, filed on Aug. 27, 2019, now Pat. No. 11,094,710.

(30) Foreign Application Priority Data

Feb. 12, 2019   (KR) .......................... 10-2019-0016234

(51) Int. Cl.

| | |
|---|---|
| *H10B 43/27* | (2023.01) |
| *H10B 41/10* | (2023.01) |
| *H10B 41/27* | (2023.01) |
| *H10B 41/30* | (2023.01) |
| *H10B 41/40* | (2023.01) |

(Continued)

(52) U.S. Cl.
CPC ............. *H10B 43/27* (2023.02); *H10B 41/10* (2023.02); *H10B 41/27* (2023.02); *H10B 41/30* (2023.02); *H10B 41/40* (2023.02); *H10B 43/10* (2023.02); *H10B 43/30* (2023.02); *H10B 43/40* (2023.02)

(58) Field of Classification Search
None
See application file for complete search history.

(56) References Cited

U.S. PATENT DOCUMENTS

| 9,627,403 B2 | 4/2017 | Liu et al. |
| 9,754,963 B1 | 9/2017 | Kawamura et al. |

(Continued)

FOREIGN PATENT DOCUMENTS

| CN | 107342289 A | 11/2017 |
| CN | 108461502 A | 8/2018 |

(Continued)

OTHER PUBLICATIONS

First Notification of Office Action dated Jan. 20, 2023 for Chinese Application No. 201910916000.9.

*Primary Examiner* — Nduka E Ojeh

(57) ABSTRACT

A method of manufacturing a semiconductor device includes: forming a first patterned stack structure including a cell region, a first portion in a first contact region, and a second portion in a second contact region, the second portion of the first patterned stack structure including a first opening; forming a second patterned stack structure including a third portion over the cell region and the second contact region of the first patterned stack structure; forming a second opening penetrating the third portion of the second patterned stack structure, the second opening being coupled to the first opening; and forming a third opening penetrating the first portion of the first patterned stack structure when the second opening is formed.

16 Claims, 21 Drawing Sheets

(51) Int. Cl.
    *H10B 43/10*     (2023.01)
    *H10B 43/30*     (2023.01)
    *H10B 43/40*     (2023.01)

(56) References Cited

U.S. PATENT DOCUMENTS

| | | |
|---|---|---|
| 2016/0013405 A1 | 1/2016 | Kim |
| 2016/0027743 A1 | 1/2016 | Kakisaki |
| 2016/0308016 A1 | 10/2016 | Choi et al. |
| 2019/0319039 A1* | 10/2019 | Kim ..................... H10B 43/27 |
| 2020/0203367 A1* | 6/2020 | Cheon ............... H01L 27/11565 |

FOREIGN PATENT DOCUMENTS

| | | |
|---|---|---|
| CN | 109075174 A | 12/2018 |
| CN | 111341779 A | 6/2020 |
| JP | 2011096780 A | 5/2011 |
| KR | 20150079495 A | 7/2015 |

\* cited by examiner

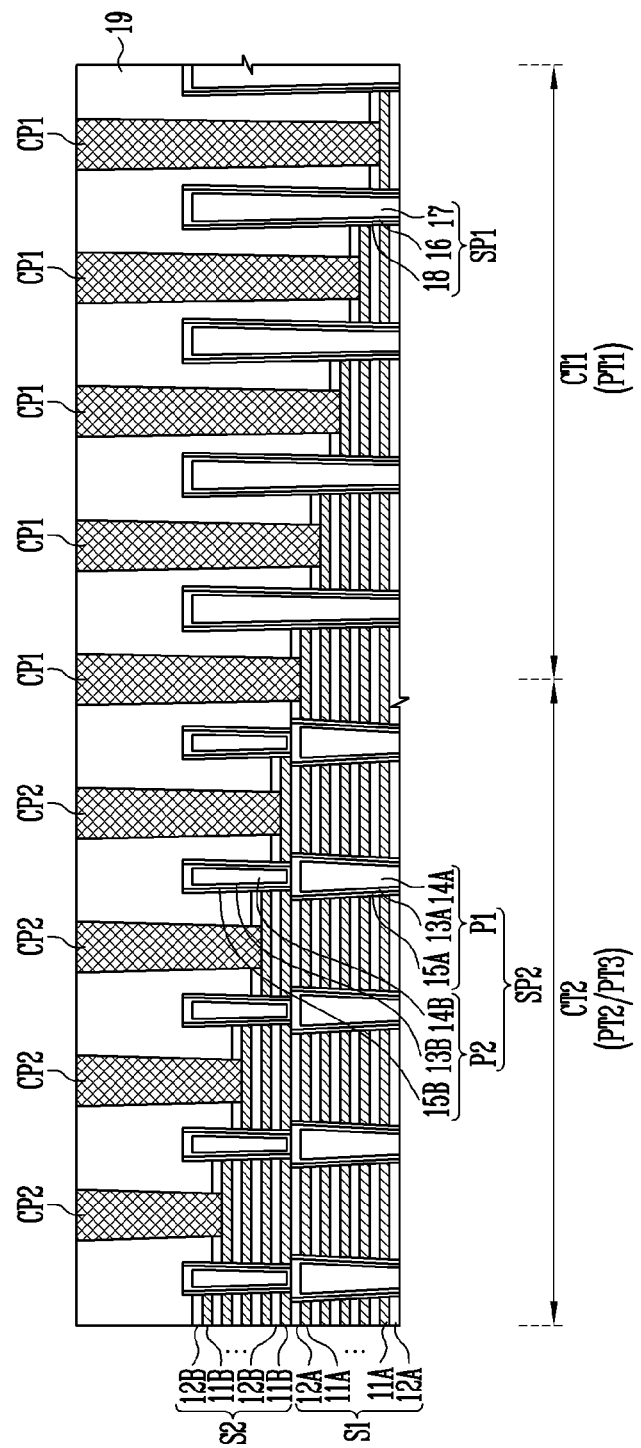

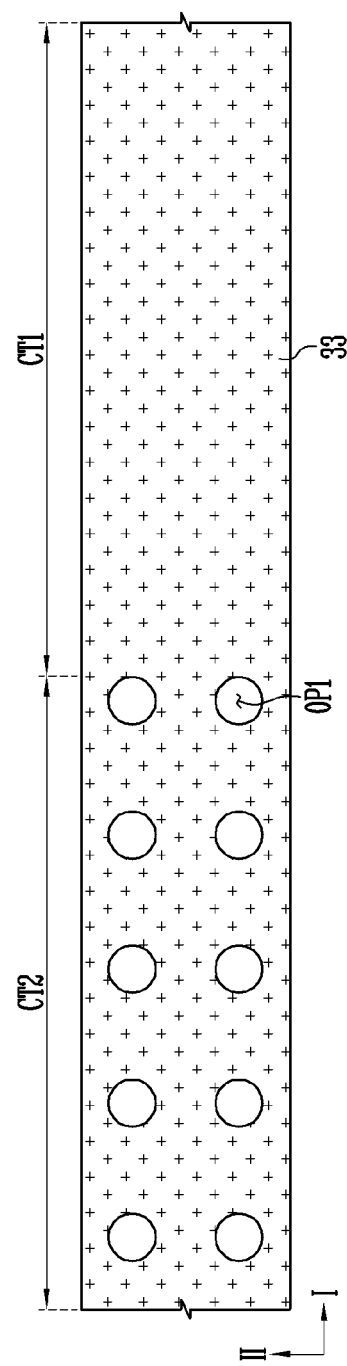

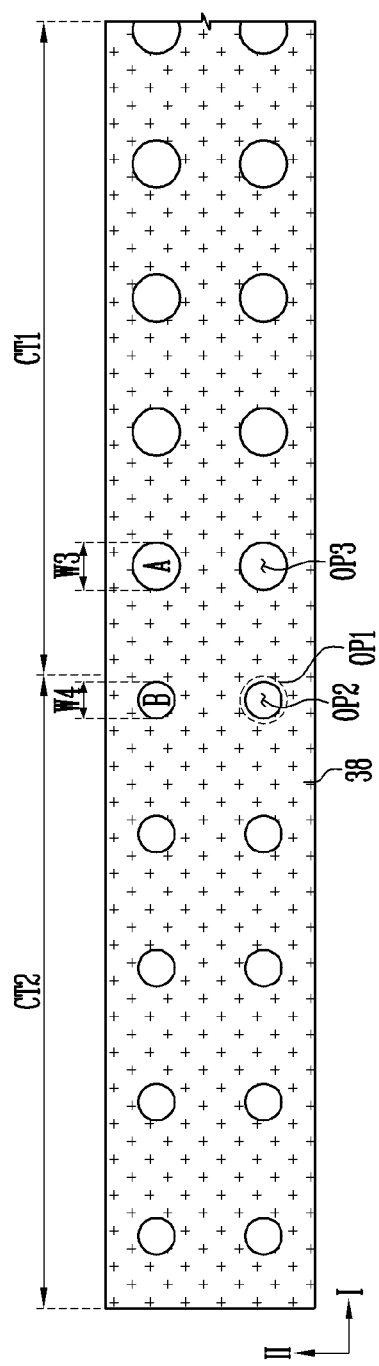

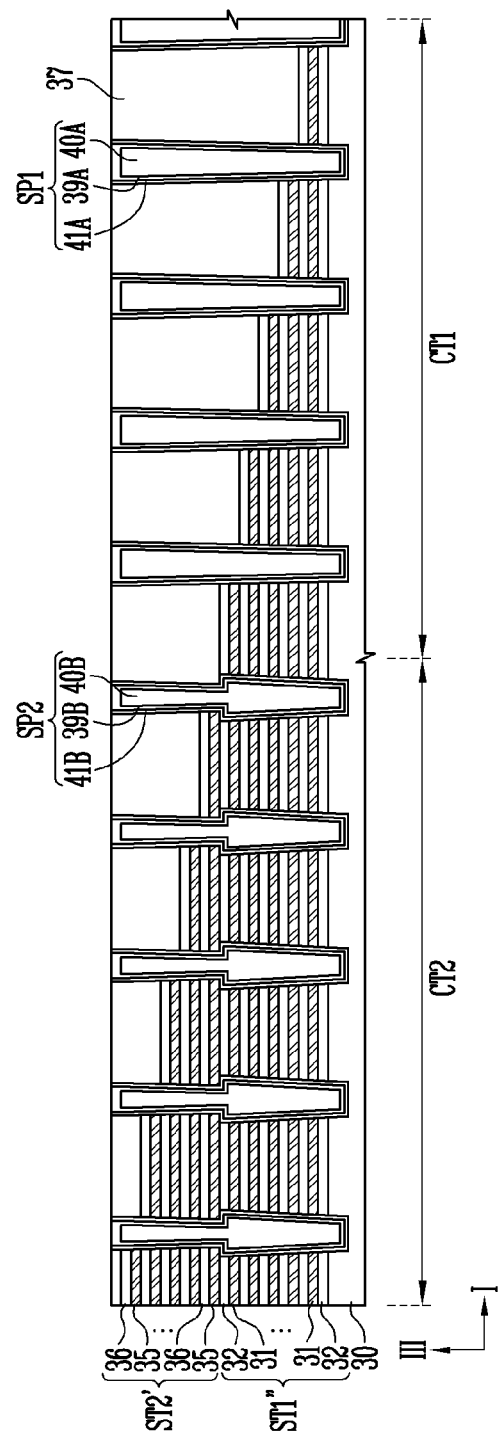

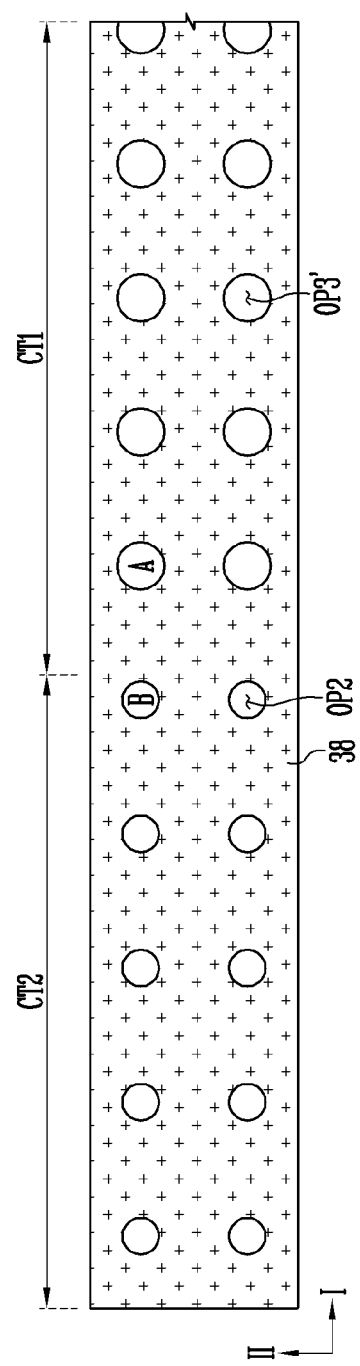

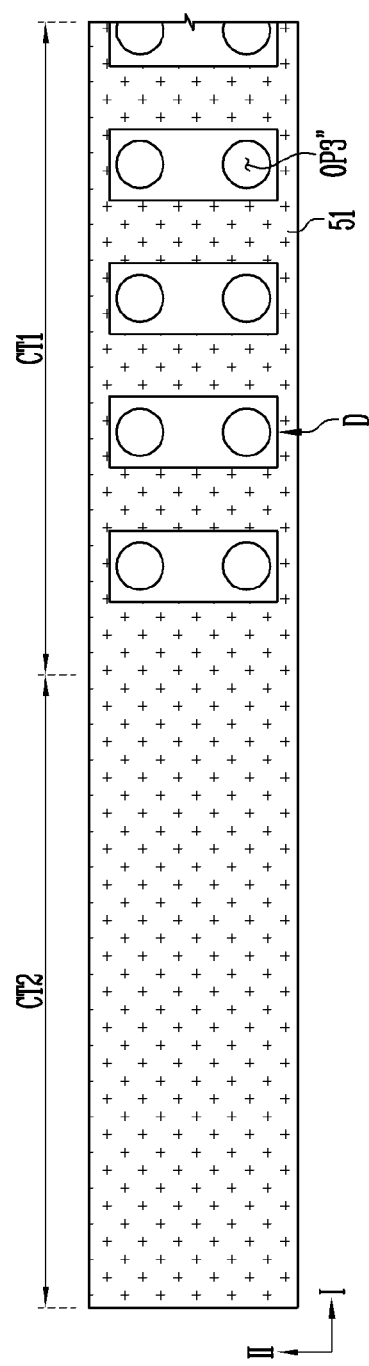

MANUFACTURING METHOD OF SEMICONDUCTOR DEVICE INCLUDING STEPPING STRUCTURE AND SUPPORTING STRUCTURE

CROSS-REFERENCE TO RELATED APPLICATION

The present application is a continuation of U.S. patent application Ser. No. 16/552,905, filed Aug. 27, 2019, and claims priority under 35 U.S.C. § 119(a) to Korean patent application number 10-2019-0016234, filed on Feb. 12, 2019, in the Korean Intellectual Property Office, the entire disclosure of which is incorporated herein by reference.

BACKGROUND

1. Technical Field

The present disclosure generally relates to an electronic device, and more particularly, to a semiconductor device and a manufacturing method thereof.

2. Related Art

A nonvolatile memory device is a memory device in which stored data is maintained as it is even when the supply of power is interrupted. As the degree of integration of two-dimensional nonvolatile memory devices with memory cells increases, a three-dimensional nonvolatile memory device has been developed.

The three-dimensional memory device includes interlayer insulating layers and gate electrodes, which are alternately stacked, and channel layers penetrating the interlayer insulating layers and the gate electrodes, and memory cells are stacked along the channel layers. Various structures and manufacturing methods have been developed so as to improve the operational reliability of the three-dimensional nonvolatile memory device.

SUMMARY

Embodiments of the present disclosure relate to a semiconductor device having a stable structure, and improved characteristics, and a relatively simple manufacturing method of the semiconductor device.

In accordance with an aspect of the present disclosure, there is provided a semiconductor device including: a first stepped structure including a first portion and a second portion; a second stepped structure including a third portion on the second portion of the first stepped structure; a first supporting structure penetrating the first portion of the first stepped structure, the first supporting structure including a sidewall having a substantially constant slope; and a second supporting structure penetrating the second portion of the first stepped structure and the third portion of the second stepped structure, the second supporting structure including a sidewall having an inflection point.

In accordance with an aspect of the present disclosure, there is provided a semiconductor device including: a first stepped structure including a first portion and a second portion; a second stepped structure including a third portion disposed over the second portion of the first stepped structure; an insulating layer disposed over the first stepped structure and the second stepped structure; a first supporting structure penetrating the first portion of the first stepped structure and the insulating layer; and a second supporting structure penetrating the second portion of the first stepped structure and the third portion of the second stepped structure, wherein a first sidewall of the first supporting structure has a first slope at a specific level and a second sidewall of the second supporting structure has a second slope at a specific level, the first slope being different from the second slope.

In accordance with another aspect of the present disclosure, there is provided a method of manufacturing a semiconductor device, the method including: forming a first patterned stack structure including a cell region, a first portion in a first contact region, and a second portion in a second contact region, the second portion of the first patterned stack structure including a first opening; forming a second patterned stack structure including a third portion over the cell region and the second contact region of the first patterned stack structure; forming a second opening penetrating the third portion of the second patterned stack structure, the second opening being coupled to the first opening; and forming a third opening penetrating the first portion of the first patterned stack structure when the second opening is formed.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 1A, 1B, and 1C are cross-sectional views each illustrating a structure of a semiconductor device in accordance with an embodiment of the present disclosure.

FIGS. 2A, 2B, 3A, 3B, 4A, 4B, 5, 6, and 7 illustrate a manufacturing method of a semiconductor device according to an embodiment of the present disclosure.

FIGS. 8A, 8B, 9A, and 9B illustrate a manufacturing method of a semiconductor device according to an embodiment of the present disclosure.

DETAILED DESCRIPTION

Figure 1A:
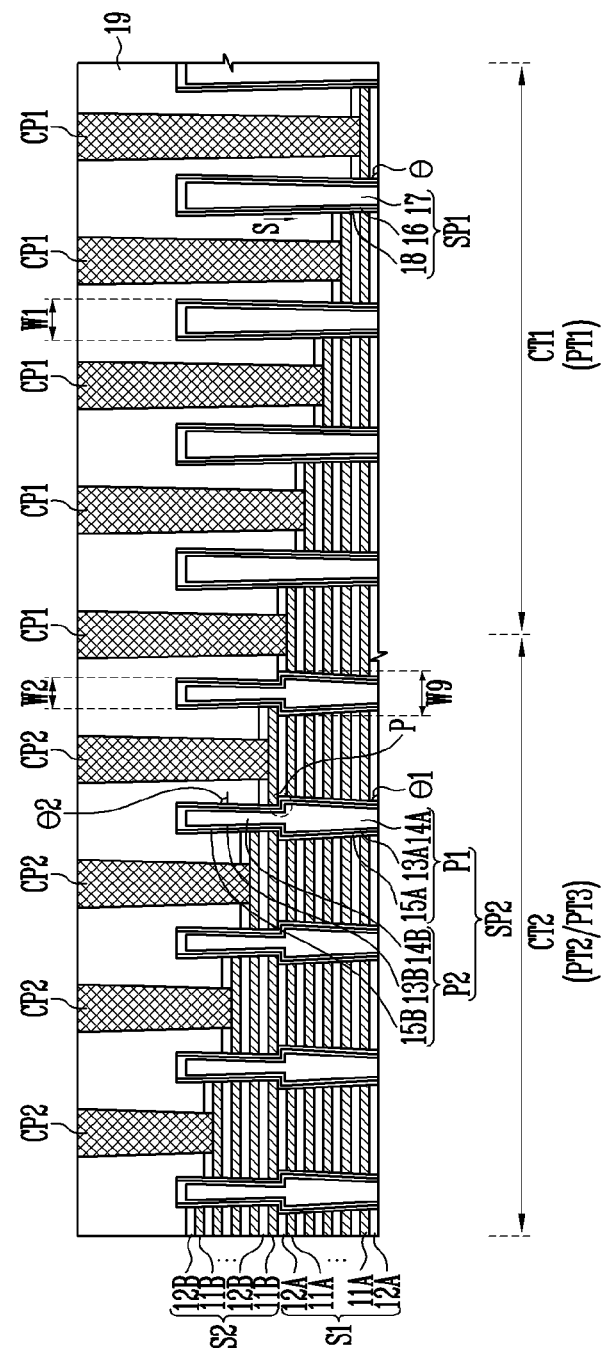

Hereinafter, various embodiments of the present invention will be described. In the drawings, the thicknesses and the intervals of elements are exaggerated for convenience of illustration, and may be exaggerated compared to an actual physical thickness. In describing the present disclosure, well-known features peripheral to the principal point of the present invention may be omitted. It should also be noted that in giving reference numerals to elements of each drawing, like reference numerals refer to like elements even though like elements are shown in different drawings.

In the entire specification, when a first element is referred to as being "connected" or "coupled" to a second element, the first element can be directly connected or coupled to the second element, or be indirectly connected or coupled to the second element with one or more intervening elements interposed therebetween. In addition, when an element is referred to as "including" a component, this indicates that the element may further include another component instead of excluding another component unless there is different disclosure.

Figure 1C:
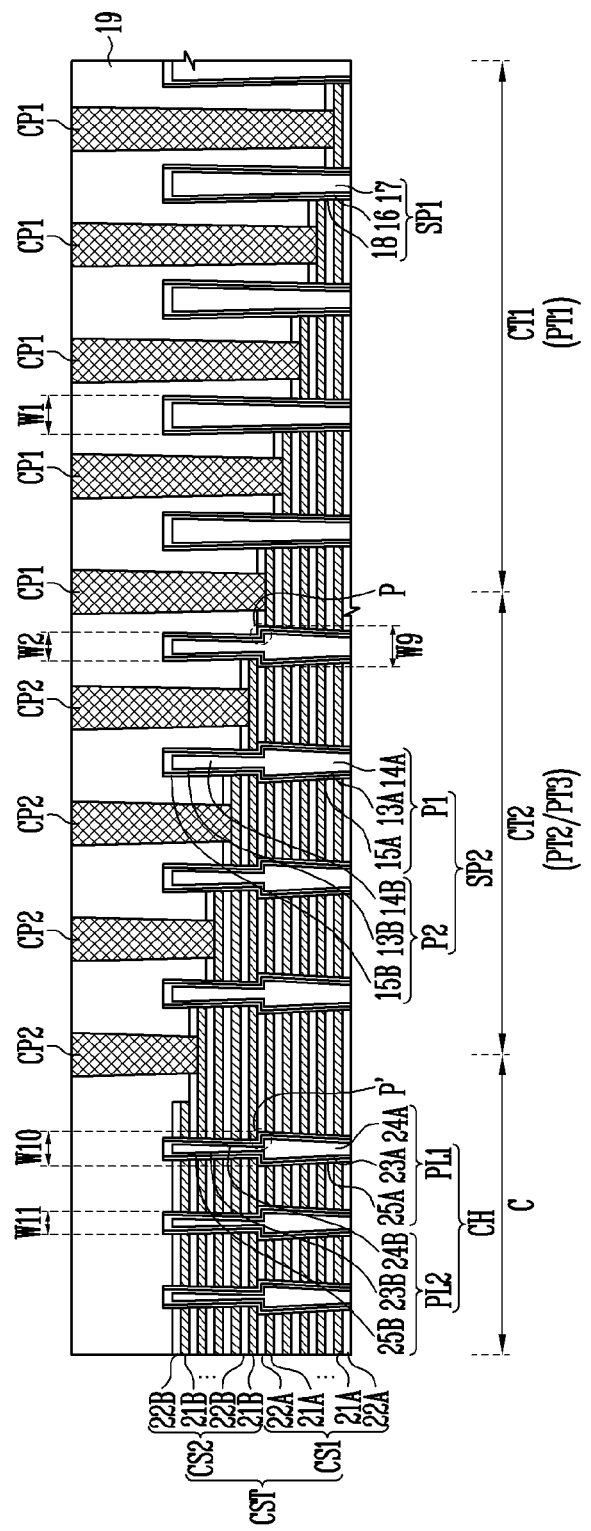

FIGS. 1A, 1B, and 1C are cross-sectional views each illustrating a structure of a semiconductor device in accordance with an embodiment of the present disclosure.

Referring to FIG. 1A, the semiconductor device in accordance with the embodiment of the present disclosure includes a first stepped structure S1, a second stepped structure S2, first supporting structures SP1, and second supporting structures SP2. Also, the semiconductor device may further include an insulating layer 19 and contact plugs CP1 and CP2. In addition, a lower structure (not shown) may be disposed under the bottom surface of the first stepped structure S1. The lower structure may include one or more of a substrate, a source layer, a peripheral circuit, and the like. Alternatively, the lower structure may include a connection pattern that connects the first supporting structures SP1 to each other, connects the second supporting structures SP2 to each other, or connects the first supporting structures SP1 and the second supporting structures SP2 to each other.

The first stepped structure S1 includes a first portion PT1 in a first contact region CT1 and a second portion PT2 in a second contact region CT2. The first stepped structure S1 may include one or more first conductive layers 11A and one or more first insulating layers 12A, which are alternately stacked. The first conductive layers 11A may function as gate electrodes of a memory cell, a select transistor, and the like, or as pads connected to the memory cell, the select transistor, and the like. The first conductive layers 11A may include polysilicon or include a metal such as tungsten. The first insulating layers 12A may include an insulating material such as oxide.

In an embodiment, the first portion PT1 of the first stepped structure S1 in the first contact region CT1 may have a stepped shape. In addition, the second portion PT2 of the first stepped structure S1 in the second contact region CT2 may have a substantially uniform height. First contact plugs CP1 may be electrically connected to the first conductive layers 11A in the first contact region CT1, respectively.

The second stepped structure S2 is disposed on the top surface (or an upper surface) of the first stepped structure S1. For example, the second stepped structure S2 may be disposed on the second portion PT2 of the first stepped structure S1 in the second contact region CT2. The second stepped structure S2 may include second conductive layers 11B and second insulating layers 12B, which are alternately stacked. The second conductive layers 11B may function as gate electrodes of a memory cell, a select transistor, and the like, or as pads connected to the memory cell, the select transistor, and the like. The second conductive layers 11B may include polysilicon or include a metal such as tungsten. The second insulating layers 12B may include an insulating material such as oxide.

In an embodiment, a third portion PT3 of the second stepped structure S2 in the second contact region CT2 may have a stepped shape. Second contact plugs CP2 may be electrically connected to the second conductive layers 11B in the second contact region CT2, respectively.

The first supporting structure SP1 may penetrate the first portion PT1 of the first stepped structure S1 in the first contact region CT1. The first supporting structure SP1 may include a first semiconductor pattern 16, a first gap fill layer 17 in the first semiconductor pattern 16, and a first dielectric layer 18 surrounding a sidewall of the first semiconductor pattern 16. The first dielectric layer 18 may include a single layer or a plurality of layers.

The first supporting structure SP1 may have a width (e.g., a diameter) that decreases along a direction from an upper surface to a lower surface thereof. In an embodiment, a sidewall of the first supporting structure SP1 may have a substantially constant slope θ. For example, a value of the slope θ of the sidewall of the first supporting structure SP1 is in a range from 95% to 105%, from 97% to 103%, from 99% to 101%, from 99.5% to 100.5%, or from 99.9% to 100.1% of an average value of the slope θ. The slope θ of the sidewall of the first supporting structure SP may substantially maintain a positive value or maintain a negative value. For example, the sidewall of the first supporting structure SP does not have an inflection point at which the slope θ is changed from a positive value to a negative value or is changed from a negative value to a positive value. The first supporting structure SP1 may have a smooth sidewall S.

The first supporting structure SP1 has a width (e.g., a diameter) substantially equal to or different from that of the second supporting structure SP2. For example, an upper surface of the first supporting structure SP1 may have a diameter W1 greater than that W2 of an upper surface of the second supporting structure SP2. In addition, an upper surface of a first plug P1 may have a diameter W9 that is substantially equal to the diameter W1 of the upper surface of the first supporting structure SP1. For example, a difference between the diameters W1 and W9 is less than 5%, 3%, 1%, 0.5%, 0.3%, or 0.1% of an average value of the diameters W1 and W9. At the same level, the first plug P1 may have a diameter greater than that of the first supporting structure SP1. For example, a diameter of a first surface of the first plug P1 may be greater than that of a second surface of the first supporting structure SP1, when the first surface and the second surface are obtained by cutting the first plug P1 and the first supporting structure SP1, respectively, using a plane that is parallel to and spaced part from the lower surface of the first stepped structure S1 by a given distance. Also, at the same level, a second plug P2 may have a diameter smaller than that of the first supporting structure SP1.

The second supporting structure SP2 may penetrate the second portion PT2 of the first stepped structure S1 in the second contact region CT2 and the third portion PT3 of the second stepped structure S2 in the second contact region CT2. The second supporting structure SP2 may include the first plug P1 and the second plug P2 connected to the first plug P1. The first plug P1 may penetrate the second portion PT2 of the first stepped structure S1 in the second contact region CT2. The second plug P2 may be located on an upper surface of the first plug P1, and penetrate the third portion PT3 of the second stepped structure S2 in the second contact region CT2. The upper surface of the first plug P1 and an upper surface of the second portion PT2 of the first stepped structure S1 may be substantially located at the same level. For example, the upper surface of the first plug P1 and an upper surface of an uppermost first insulating layer 12A of the first stepped structure S1 may be substantially coplanar with each other. An upper surface of the second plug P2 and the upper surface of the first supporting structure SP1 may be substantially located at the same level.

Each of the first and second plugs P1 and P2 may have a diameter that decreases along a direction from an upper surface to a lower surface thereof. A sidewall of the first plug P1 may have a first constant slope θ1, and a sidewall of the second plug P2 may have a second constant slope θ2. The first slope θ1 and the second slope θ2 may be substantially equal to or different from each other. For example, the first slope θ1 and the second slope θ2 may be substantially equal to each other when a maximum difference between the first and second slopes θ1 and θ2 is less than 5%, 3%, 1%, 0.5%, 0.3%, or 0.1% of an average value of the first and second slopes θ1 and θ2. Otherwise, the first slope θ1 and second slope θ2 may be different from each other. In addition, the sidewall of the first supporting structure SP1 and the sidewall of the second supporting structure SP2 may have different slopes at substantially the same level.

A lower surface of the second plug P2 may have a diameter narrower than that of the upper surface of the first plug P1. Therefore, the slope of the sidewall of the second supporting structure SP2 may have at least one inflection point P where the slope of the sidewall changes to have a different value. For example, the inflection point P may be located at a point at which the first plug P1 and the second plug P2 are connected to each other. The inflection point P may be located between the first stepped structure S1 and the second stepped structure S2. For example, the inflection point P may be disposed between an upper surface of the first plug P1 and a lower surface of the second plug P2. The number of inflection points P included in the second supporting structure SP2 is greater than that included in the first supporting structures SP1. For example, in the embodiment shown in FIG. 1A, the second supporting structure SP2 may include a single inflection point P and the first supporting structure SP1 may not include any inflection point.

The first plug P1 may include a second semiconductor pattern 13A, a second gap fill layer 14A, and a second dielectric layer 15A. The second plug P2 may include a third semiconductor pattern 13B, a third gap fill layer 14B, and a third dielectric layer 15B. Therefore, the second supporting structure SP2 may include the second and third semiconductor patterns 13A and 13B, the second and third gap fill layers 14A and 14B, and the second and third dielectric layers 15A and 15B.

Each of the layers of the first plug P1 and a corresponding one of the layers of the second plug P2 may be formed together. For example, the second semiconductor pattern 13A and the third semiconductor pattern 13B may be formed as a single layer, the second gap fill layer 14A and the third gap fill layer 14B may be formed as a single layer, and the second dielectric layer 15A and the third dielectric layer 15B may be formed as a single layer. Each of the second and third dielectric layers 15A and 15B may include a single layer or a plurality of layers.

Each of the layers of the second supporting structure SP2 and a corresponding one of the layers of the first supporting structure SP1 may be formed together. For example, the second and third semiconductor patterns 13A and 13B may be formed together with the first semiconductor pattern 16, and include the same material as the first semiconductor pattern 16. The second and third gap fill layers 14A and 14B may be formed together with the first gap fill layer 17, and include the same material as the first gap fill layer 17. The second and third dielectric layers 15A and 15B may be formed together with the first dielectric layer 18, and include the same material as the first dielectric layer 18.

The insulating layer 19 may be located on an upper surface of the first stepped structure S1 and an upper surface of the second stepped structure S2. The insulating layer 19 includes an insulating material such as oxide. The first and second supporting structures SP1 and SP2 may penetrate corresponding portions of the insulating layer 19. The first supporting structures SP1 may penetrate the first portion PT1 of the insulating layer 19 and the first portion PT1 of the first stepped structure S1 in the first contact region CT1. The second supporting structures SP2 may penetrate the second portion PT2 of the insulating layer 19, the third portion PT3 of the second stepped structure S2 in the second contact region CT2, and the second portion PT2 of the first stepped structure S1 in the second contact region CT2. The first supporting structures SP1 and the second supporting structures SP2 may have substantially the same height. For example, when each of the first supporting structures SP1 has a first height between an upper surface and a bottom surface thereof and each of the second supporting structures SP2 has a second height between an upper surface and a bottom surface thereof, a difference between the first height and the second height is less than 5%, 3%, 1%, 0.5%, 0.3%, or 0.1% of an average value of the first and second heights. In an embodiment, the upper surfaces of the first supporting structures SP1 and the upper surfaces of the second supporting structures SP2 may be substantially located at the same level.

Referring to FIG. 1B, a second supporting structure SP2 may include a first plug P1 and a second plug P2, and an interface may exist between the first plug P1 and the second plug P2. For example, each of layers 13A, 14A, and 15A of the first plug P1 and a corresponding one of layers 13B, 14B, and 15B of the second plug P2 may be formed through different processes.

The first plug P1 may include a second semiconductor pattern 13A, a second gap fill layer 14A in the second semiconductor pattern 13A, and a second dielectric layer 15A surrounding a sidewall of the second semiconductor pattern 13A. The second plug P2 may include a third semiconductor pattern 13B, a third gap fill layer 14B in the third semiconductor pattern 13B, and a third dielectric layer 15B surrounding a sidewall of the third semiconductor pattern 13B.

An interface may exist between an upper surface of the second semiconductor pattern 13A and a lower surface of the third semiconductor pattern 13B, and the second semiconductor pattern 13A and the third semiconductor pattern 13B may be layers formed through separate processes. The second semiconductor pattern 13A may include a pad for securing an overlay margin with the third semiconductor pattern 13B. The second gap fill layer 14A and the third gap fill layer 14B may be spaced apart from each other, and be layers formed through separate processes. The second dielectric layer 15A and the third dielectric layer 15B may be spaced apart from each other, and be layers formed through separate processes.

Each of the layers of the second plug P2 may be formed together with a corresponding one of the layers of the first supporting structure SP1. The third semiconductor pattern 13B may be a layer formed through the same process as the first semiconductor pattern 16, and include the same material as the first semiconductor pattern 16. The third gap fill layer 14B may be a layer formed through the same process as the first gap fill layer 17, and include the same material as the first gap fill layer 17. The third dielectric layer 15B may be a layer formed through the same process as the first dielectric layer 18, and include the same material as the first dielectric layer 18.

The remaining portions of the structure of the semiconductor device shown in FIG. 1B are similar to those described with reference to FIG. 1A, and therefore, detailed descriptions will be omitted herein for the interest of brevity.

Referring to FIG. 1C, the semiconductor device in FIG. 1A may further include a cell stack structure CST located in a cell region C. The cell stack structure CST may include a first cell structure CS1 and a second cell structure CS2 located on an upper surface of the first cell structure CS1. The first cell structure CS1 may include third conductive layers 21A and third insulating layers 22A, which are alternately stacked. The second cell structure CS2 may include fourth conductive layers 21B and fourth insulating layers 22B, which are alternately stacked. The third conductive layers 21A and the fourth conductive layers 21B may function as gate electrodes of a memory cell, a select transistor, and the like.

The first cell structure CS1 may be connected to the first stepped structure S1. For example, the third conductive layers 21A of the first cell structure CS1 may be respectively connected to the first conductive layers 11A of the first stepped structure S1. The third conductive layer 21A and the first conductive layer 11A, which are located at the same level, may form a single layer. The third insulating layers 22A of the first cell structure CS1 may be respectively connected to the first insulating layers 12A of the first stepped structure S1. The third insulating layer 22A and the first insulating layer 12A, which are located at the same level, may form a single layer.

The second cell structure CS2 may be connected to the second stepped structure S2. For example, the fourth conductive layers 21B of the second cell structure CS2 may be respectively connected to the second conductive layers 11B of the second stepped structure S2. The fourth conductive layer 21B and the second conductive layer 11B, which are located at the same level, may form a single layer. The fourth insulating layers 22B of the second cell structure CS2 may be respectively connected to the second insulating layers 12B of the second stepped structure S2. The fourth insulating layer 22B and the second insulating layer 12B, which are located at the same level, may form a single layer.

The semiconductor device may include channel structures CH. The channel structures CH are located in the cell region C, and penetrate corresponding potions of the cell stack structure CST. The channel structures CH may have substantially the same height as the first supporting structures SP1 and the second supporting structures SP2. Upper surfaces of the channel structures CH may be substantially located at the same level as those of the first and second supporting structures SP1 and SP2.

Each of the channel structures CH may include a first plug PL1 and a second plug PL2 connected to the first plug PL1. The first plug PL1 may penetrate a portion of the first cell structure CS1 in the cell region C. An upper surface of the first plug PL1 and an upper surface of the first cell structure CS1 may be substantially located at the same level. Also, the upper surface of the first plug PL1 may be substantially located at the same level as that of the first plug P1.

The second plug PL2 may be located on an upper surface of the first plug PL1, and penetrate a portion of the second cell structure CS2. In the embodiment shown in FIG. 1C, an upper surface of the second plug PL2 protrudes from an upper surface of the second cell structure CS2. However, embodiments of the present disclosure are not limited thereto. For example, the upper surface of the second plug PL2 and the upper surface of the second cell structure CS2 may be substantially located at the same level. Also, the upper surface of the second plug PL2 may be substantially located at the same layer as those of the first and second supporting structures SP1 and SP2.

Each of the first and second plugs PL1 and PL2 may have a width (e.g., a diameter) that decreases in a direction from an upper surface to a lower surface thereof. Therefore, like the second supporting structure SP2, the slope of a sidewall of each of the channel structures CH may have at least one inflection point P'. The inflection point P' may be located at substantially the same level as the inflection point P of the second supporting structure SP2.

The channel structure CH may have a width (e.g., a diameter) that is substantially equal to or different from those of the first and second supporting structures SP1 and SP2. The upper surface of the first plug PL1 may have a diameter W10 narrower than a diameter W9 of the upper surface of the first plug P1. At the same level, the first plug PL1 has a diameter narrower than that of the first plug PL1. The upper surface of the second plug PL2 may have a diameter W11 narrower than a diameter W2 of the second plug PL2. At the same level, the second plug PL2 has a diameter narrower than that of the second plug P2. The diameter W11 of the upper surface of the second plug PL2 may be narrower than the diameter W10 of the upper surface of the first plug PL1, and the diameter W10 of the upper surface of the first plug PL1 may be narrower than the diameter W1 of the upper surface of the first supporting structure SP1. At the same level, the first supporting structure SP1 has a diameter greater than that of the channel structure CH. The sidewall of the first supporting structure SP1 may have a different slope from the sidewall of the channel structure CH at substantially the same level.

The first plug PL1 may include a first channel layer 23A, a first gap fill layer 24A, and a first memory layer 25A. The second plug PL2 may include a second channel layer 23B, a second gap fill layer 24B, and a second memory layer 25B. Therefore, the channel structure CH may include the first and second channel layers 23A and 23B, the first and second gap fill layers 24A and 24B, and the first and second memory layers 25A and 25B. The first and second memory layers 25A and 25B may include a tunnel insulating layer, a data storage layer, and a charge blocking layer. The data storage layer may include a floating gate, a charge trapping material, polysilicon, nitride, a phase change material, a variable resistance material, nano dots, and the like.

The channel structures CH each may have a structure similar to that of each of the second supporting structures SP2 described above with reference to FIGS. 1A and 1B.

In an embodiment, similarly to the second supporting structure SP2 in FIG. 1A, the layers of the first plug PL1 and the layers of the second plug PL2 may be formed together. The first channel layer 23A and the second channel layer 23B may be formed as a single layer, the first gap fill layer 24A and the second gap fill layer 24B may be formed as a single layer, and the first memory layer 25A and the second memory layer 25B may be formed as a single layer.

The layers of the channel structure CH may be formed together with those of the first and second supporting structures SP1 and SP2. The channel layers 23A and 23B of the channel structure CH may be formed together with the second and third semiconductor patterns 13A and 13B of the second supporting structure SP2 and the first semiconductor pattern 16 of the first supporting structure SP1. The channel layers 23A and 23B may include the same material as the second and third semiconductor patterns 13A and 13B and the first semiconductor pattern 16. The gap fill layers 24A and 24B of the channel structure CH may be formed together with the first gap fill layer 17 of the first supporting structure SP1 and the second and third gap fill layers 14A and 14B of the second supporting structure SP2. The gap fill layers 24A and 24B may include the same material as the first gap fill layer 17 and the second and third gap fill layers 14A and 14B. The memory layers 25A and 25B of the channel structure CH may be formed together with the first dielectric layer 18 of the first supporting structure SP1 and the second and third dielectric layers 15A and 15B of the second supporting structure SP2. The memory layers 25A and 25B may include the same material as the first dielectric layer 18 and the second and third dielectric layers 15A and 15B.

In another embodiment, similarly to the second supporting structure SP2 in FIG. 1B, the first plug PL1 and the second plug PL2 of the channel structure CH shown in FIG. 1C may be formed through separate processes. An interface (not shown) may exist between an upper surface of the first channel layer 23A and a lower surface of the second channel layer 23B, and the first channel layer 23A and the second channel layer 23B may be formed through separate processes. The first channel layer 23A may include a pad for securing an overlay margin with the second channel layer 23B. The first gap fill layer 24A and the second gap fill layer 24B may be spaced apart from each other, and be layers formed through separate processes. The first memory layer 25A and the second memory layer 25B may be spaced apart from each other, and be layers formed through separate processes.

The layers of the first plug PL1 of the channel structure CH may be formed together with the layers of the first plug P1 of the second supporting structure SP2. The first channel layer 23A may be formed together with the second semiconductor pattern 13A, and include the same material as the second semiconductor pattern 13A. The first gap fill layer 24A may be formed together with the second gap fill layer 14A, and include the same material as the second gap fill layer 14A. The first memory layer 25A may be formed together with the second dielectric layer 15A, and include the same material as the second dielectric layer 15A.

The layers of the second plug PL2 of the channel structure CH may be formed together with the layers of the second plug P2 of the second supporting structure SP2 and the layers of the first supporting structure SP1. The second channel layer 23B may be formed together with the third semiconductor pattern 13B and the first semiconductor pattern 16, and include the same material as the third semiconductor pattern 13B and the first semiconductor pattern 16. The second gap fill layer 24B may be formed together with the third gap fill layer 14B and the first gap fill layer 17, and include the same material as the third gap fill layer 14B and the first gap fill layer 17. The second memory layer 25B may be formed together with the third dielectric layer 15B and the first dielectric layer 18, and include the same material as the third dielectric layer 15B and the first dielectric layer 18.

FIGS. 2A to 4A, 2B to 4B, 5, 6, and 7 illustrate a manufacturing method of a semiconductor device according to an embodiment of the present disclosure. FIGS. 2A to 4A are plan views, and FIGS. 2B to 4B, 5, 6, and 7 are cross-sectional views.

Figure 2B:
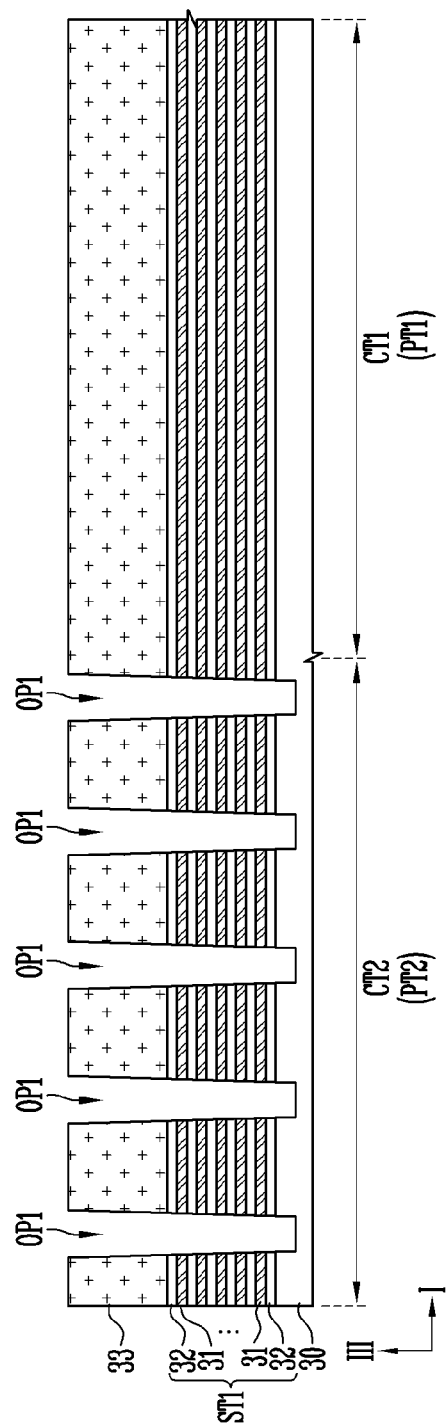

Referring to FIGS. 2A and 2B, a first stack structure ST1 is formed over a base 30. The base 30 may include a substrate, a peripheral circuit, a source layer, a sacrificial layer, an interconnection structure, and the like. The sacrificial layer may be replaced with a source layer, a connection pattern, etc. in a subsequent process. The first stack structure ST1 may include the first portion PT1 in a first contact region CT1 and the second portion PT2 in a second contact region CT2. The first contact region CT1 and the second contact region CT2 may be adjacent to each other in a first direction I.

The first stack structure ST1 may include first material layers 31 and second material layers 32, which are alternately stacked. The first material layers 31 may be layers for forming gate electrodes of a memory cell, a select transistor, and the like, and the second material layers 32 may be layers each configured for insulating neighboring gate electrodes from each other. The first material layers 31 include a material having a higher etch selectivity with respect to the second material layers 32. In an example, the first material layers 31 may be sacrificial layers including nitride, etc., and the second material layers 32 may be insulating layers including oxide, etc. In another example, the first material layers 31 may be conductive layers including polysilicon, tungsten, etc., and the second material layers 32 may be insulating layers including oxide, etc. In another embodiment, the second material layers 32 include a material having a higher etch selectivity with respect to the first material layers 31. For example, the first material layers 31 may be conductive layers including doped polysilicon, etc., and the second material layers 32 may be sacrificial layers including undoped polysilicon, etc.

Subsequently, a first mask pattern 33 is formed over the first stack structure ST1. The first mask pattern 33 may be formed to cover the first portion PT1 in the first contact region CT1, and include one or more openings located in the second contact region CT2.

Subsequently, first openings OP1 are formed by etching the first stack structure ST1, using the first mask pattern 33 as an etch barrier. The first mask pattern 33 may be a photoresist pattern. The first openings OP1 may completely penetrate the first stack structure ST1 or penetrate a portion of the first stack structure ST1. The first openings OP1 may be arranged in the first direction I and a second direction II intersecting the first direction I. The first openings OP1 may penetrate the first stack structure ST1 in a third direction III. The third direction III may be a direction perpendicular to a plane defined by the first direction I and the second direction II, and be a stacking direction.

Figure 3A:
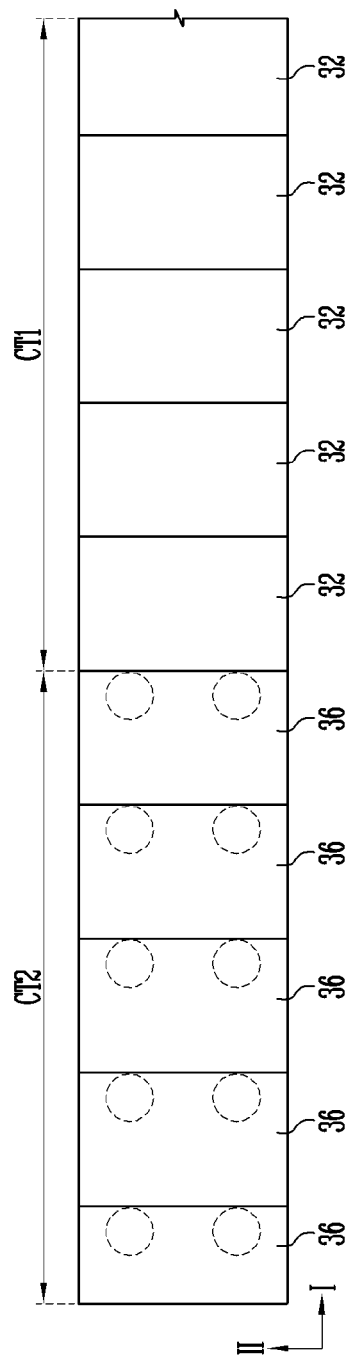
Figure 3B:
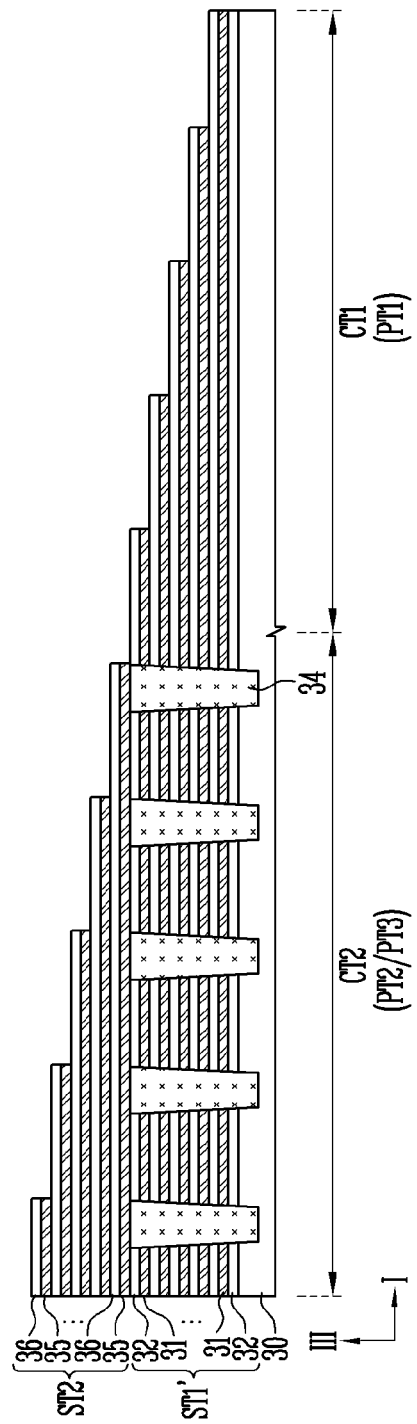

Referring to FIGS. 3A and 3B, after the first mask pattern 33 is removed, sacrificial patterns 34 are respectively formed in the first openings OP1. Before the sacrificial patterns 34 are formed, a cleaning process may be performed. The sacrificial patterns 34 may include a material having a higher etch selectivity with respect to the first, second, third, and fourth material layers 31, 32, 35, and 36. For example, the sacrificial patterns 34 may include tungsten. In another embodiment, first plugs (e.g., the first plug P1 of FIG. 1B) may be formed, rather than the sacrificial patterns 34.

Subsequently, a second initial stack structure (not shown) is formed over the first stack structure ST1. The second initial stack structure may include third material layers 35 and fourth material layers 36, which are alternately stacked. The third material layers 35 may be layers for forming gate electrodes of a memory cell, a select transistor, and the like, and the fourth material layers 36 may be layers each configured for insulating neighboring gate electrodes from each other. The third material layers 35 may include the same material as the first material layers 31, and the fourth material layers 36 may include the same material as the second material layers 32.

The third material layers 35 include a material having a higher etch selectivity with respect to the fourth material layers 36. In an example, the third material layers 35 may be sacrificial layers including nitride, etc., and the fourth material layers 36 may be insulating layers including oxide, etc. In another example, the third material layers 35 may be conductive layers including polysilicon, tungsten, etc., and the fourth material layers 36 may be insulating layers including oxide, etc. In another embodiment, the fourth material layers 36 include a material having a higher etch selectivity with respect to the third material layers 35. For example, the third material layers 35 may be conductive layers including doped polysilicon, etc., and the fourth material layers 36 may be sacrificial layers including undoped polysilicon, etc.

Subsequently, the first stacked structure ST1 and the second initial stack structure (not shown) each are patterned in a stepped shape to form a first intermediate stack structure ST1' and a second stack structure ST2. An etching process and a mask pattern reduction process are repeatedly performed using a single mask pattern, so that the patterning process can be performed. For example, a first etching process is performed using the mask pattern exposing an end portion of the second initial stack structure (not shown), a first mask pattern reduction process is performed on the mask pattern to increase the exposed portion of the mask pattern, and subsequent etching processes and mask pattern reduction processes are alternately performed to form the first intermediate stack structure ST1' and the second stack structure ST2. Thus, the first patterned stack structure ST1" and the second stack structure ST2 can be formed using the single mask pattern.

Accordingly, the first portion PT1 of the first intermediate stack structure ST1' and the third portion PT3 of the second stack structure ST2 each have a stepped shape.

Figure 4B:
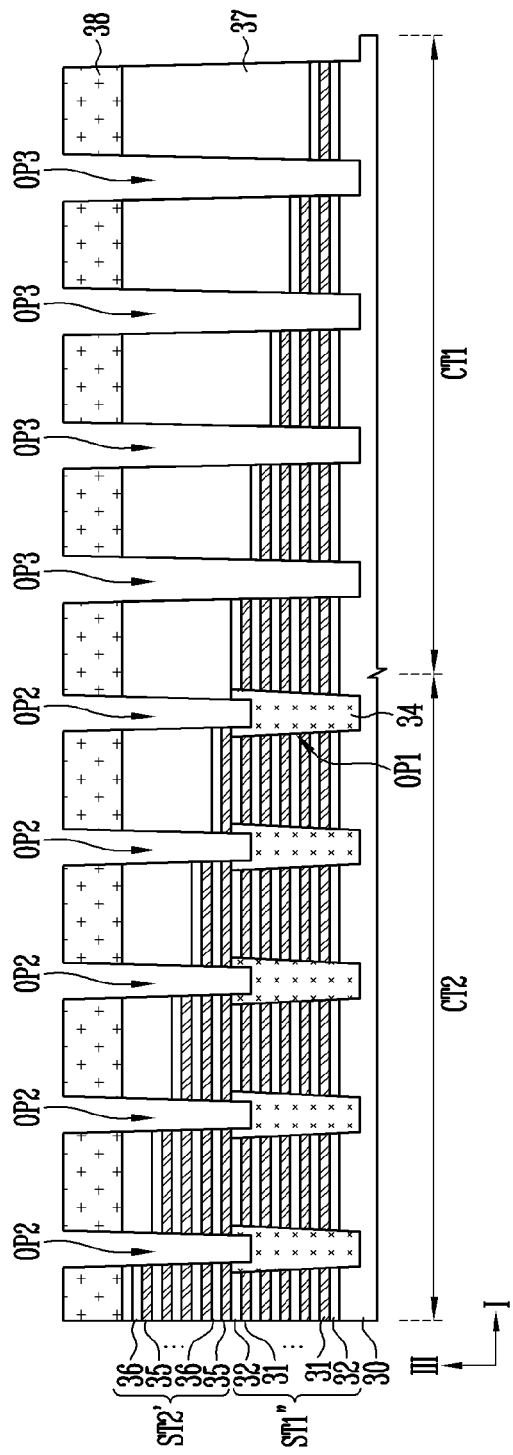

Referring to FIGS. 4A and 4B, an insulating material layer 37 is formed over the first intermediate stack structure ST1' and the second stack structure ST2. For example, an insulating material is formed over the first intermediate stack structure ST1' and the second stack structure ST2, and a planarization process is performed on the insulating material to form the insulating material layer 37. The insulating material layer 37 may include oxide. The planarization process may be a Chemical Mechanical Polishing (CMP) process.

Subsequently, a second mask pattern 38 is formed over the insulating material layer 37. The second mask pattern 38 may be a photoresist pattern. The second mask pattern 38 may include openings A located in the first contact region CT1 and openings B located in the second contact region CT2. Each of the openings A may have a diameter W3 greater than that W4 of each of the second openings B.

Subsequently, the insulating material layer, the second stack structure ST2, and the first intermediate stack structure ST1' are etched to form a second patterned stack structure ST2' and the first patterned stack structure ST1", respectively, using the second mask pattern 38 as an etch barrier. Accordingly, second openings OP2 each penetrating the insulating layer 37 and the second patterned stack structure ST2' are formed in the second contact region CT2. In addition, when the second openings OP2 are formed, third openings OP3 each penetrating the insulating layer 37 and the first patterned stack structure ST1" are formed in the first contact region CT1. The second openings OP2 may be formed to respectively correspond to the first openings OP1 that are filled with the sacrificial patterns 34.

In the etching process, an etch rate may vary with a width (e.g., the diameter W3 or W4) of each of the openings A and B of the second mask pattern 38. For example, due to an etch loading difference, the etch rate increases as the diameter increases. Because the diameter W3 of each of the openings A is greater than that W4 of each of the openings B, an etch rate in the openings A may be greater than that in the openings B, thereby forming the third openings OP3 each having a depth deeper than that of each of the second openings OP2. Accordingly, each of the second openings OP2 may be formed to have a sufficient depth to expose a top portion of a corresponding one of the sacrificial patterns 34, and each of the third openings OP3 may be formed to have a sufficient depth to expose a top portion of the base 30.

Referring to FIG. 5, after the second mask pattern 38 is removed, the sacrificial patterns 34 are removed through the second openings OP2. Before the sacrificial patterns 34 are removed, a cleansing process may be performed. Subsequently, first supporting structures SP1 and second supporting structures SP2 are formed.

The first supporting structures SP1 may be formed in the third openings OP3. The first supporting structures SP1 may penetrate the insulating layer 37 in the first contact region CT1 and the first patterned stack structure ST1" in the first contact region CT1. Each of the first supporting structures SP1 may include a first semiconductor pattern 39A, a first gap fill layer 40A, and a first dielectric layer 41A.

The second supporting structures SP2 may be formed in the first and second openings OP1 and OP2. The second supporting structures SP2 may penetrate the insulating layer 37 in the second contact region CT2 and the second patterned stack structure ST2' in the second contact region CT2, and the first patterned stack structure ST1" in the second contact region CT2. Each of the second supporting structures SP2 may include a second semiconductor pattern 39B, a second gap fill layer 40B, and a second dielectric layer 41B.

In an embodiment, a dielectric layer, a semiconductor layer, and a gap fill layer are sequentially formed over an intermediate resultant structure including the first, second, and third openings OP1, OP2, and OP3. Subsequently, after a portion of the gap fill layer is etched, a material included in the semiconductor layer is deposited. Subsequently, a planarization process is performed until an upper surface of the insulating layer 37 is exposed. Accordingly, the first supporting structures SP1 and the second supporting structures SP2 are formed together.

In another embodiment where first plugs instead of the sacrificial patterns 34 are formed in the first openings OP1, the first plugs are not removed. In addition, second plugs are formed in the second openings OP2, so that the second supporting structures SP2 including the first and second plugs can be formed.

Although the first and second dielectric layers 41A and 41B surround sidewalls and lower surfaces of the first and second semiconductor patterns 39A and 39B, respectively, in the embodiment shown in FIG. 5, the dielectric layers 41A and 41B may be formed to only surround the sidewalls of the semiconductor patterns 39A and 39B, respectively. When the base 30 is a semiconductor substrate or source, an epitaxial pattern may be formed between the first semiconductor pattern 39A and the base 30. The epitaxial pattern may be a silicon layer grown from the base 30 through an epitaxial process.

Figure 6:
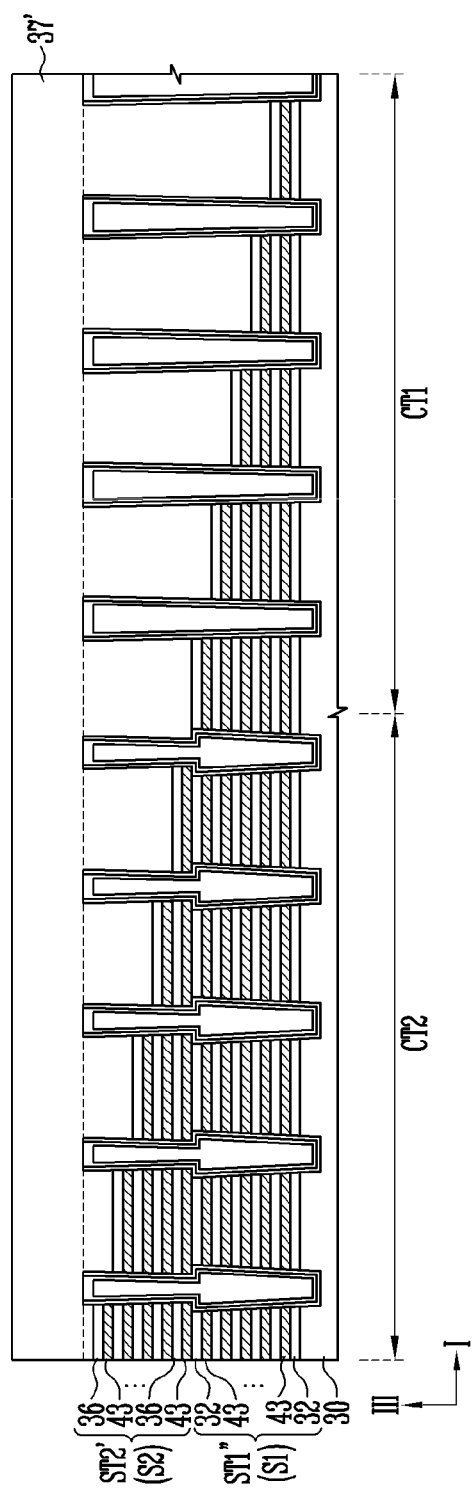

Referring to FIG. 6, the first and third material layers 31 and 35 are replaced with fifth material layers 43. For example, an insulating material is additionally deposited on the insulating material layer 37 to cover the first supporting structures SP1 and the second supporting structures SP2, thereby forming an insulating layer 37'. Subsequently, a mask pattern (not shown) is formed over the insulating layer 37'. Subsequently, one or more slits (not shown) is formed by etching the insulating layer 37', the second patterned stack structure ST2, and the first patterned stack structure ST1'', using the mask pattern as an etch barrier. Subsequently, the first and third material layers 31 and 35 are replaced with the fifth material layers 43 through the slits. The first patterned stack structure ST1'' having the fifth material layers 43 may correspond to the first stepped structure 51 and the second patterned stack structure ST2' having the fifth material layers 43 may correspond to the second stepped structure S2.

In an example, when the first and third material layers 31 and 35 are sacrificial layers and the second and fourth material layers 32 and 36 are insulating layers, openings (not shown) are formed by removing the first and third material layers 31 and 35. The first and second supporting structures SP1 and SP2 may be used as supporting structures for supporting the second and fourth material layers 32 and 36. Subsequently, a conductive material fills the openings to form the fifth material layers 43. In another example, when the first and third material layers 31 and 35 are conductive layers and the second and fourth material layers 32 and 36 are insulating layers, the first and third material layers 31 and 35 are silicided to form the fifth material layers 43. Although not shown in FIG. 6, the second and fourth material layers 32 and 36 may be replaced with sixth material layers (not shown) according to another embodiment. For example, when the first and third material layers 31 and 35 are conductive layers and the second and fourth material layers 32 and 36 are sacrificial layers, the second and fourth material layers 32 and 36 are replaced with insulating layers (not shown).

Figure 7:
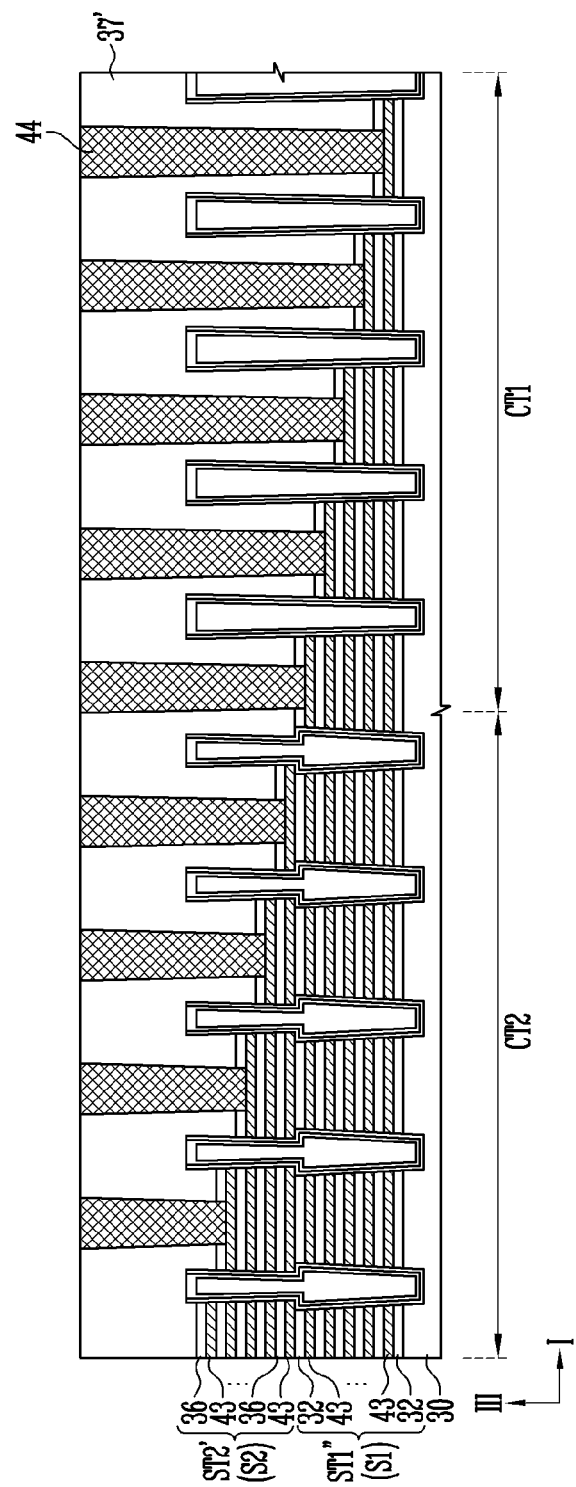

Referring to FIG. 7, contact plugs 44 are formed. The contact plugs 44 may penetrate the insulating layers 37, and be respectively connected to the fifth material layers 43. For example, after openings that penetrate the insulating layers 37' and respectively expose corresponding portions of the fifth material layers 43, a conductive layer (not shown) is formed to fill the openings. Subsequently, the contact plugs 44 are formed by performing a planarization process until an upper surface of the insulating layer 37' is exposed. The contact plugs 44 may include a metal such as tungsten.

According to the manufacturing method described above, the first supporting structures SP1 can be formed simultaneously when the second supporting structures SP2 are formed. Further, the second supporting structures SP2 and the first supporting structure SP1 can be formed to have different structures.

Figure 8B:
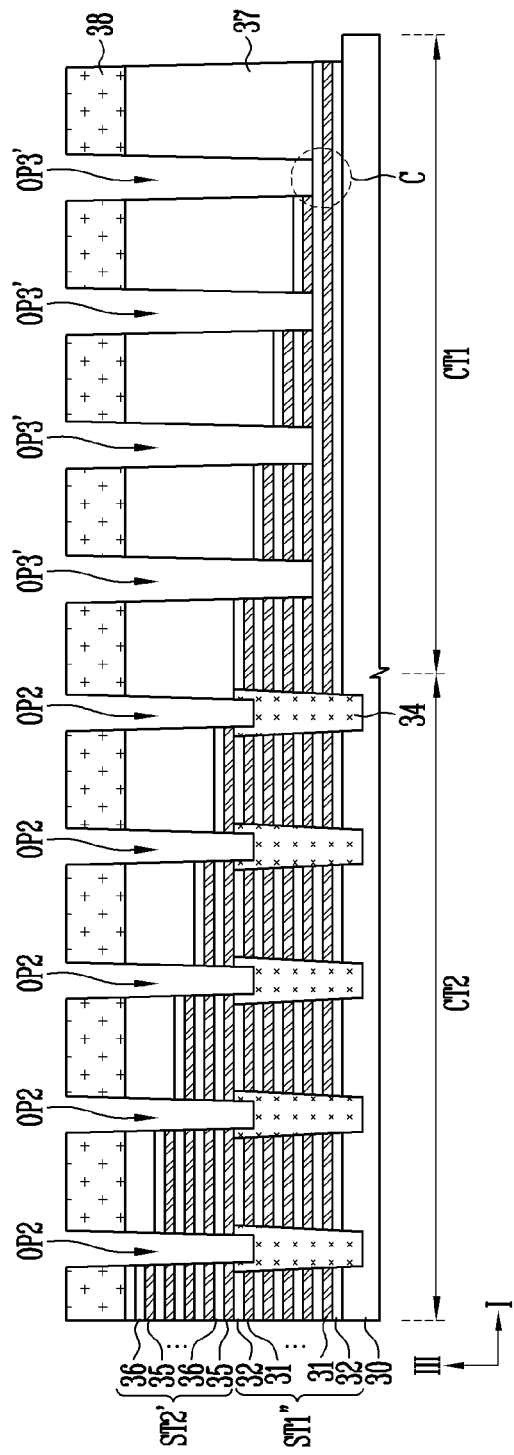
Figure 9B:
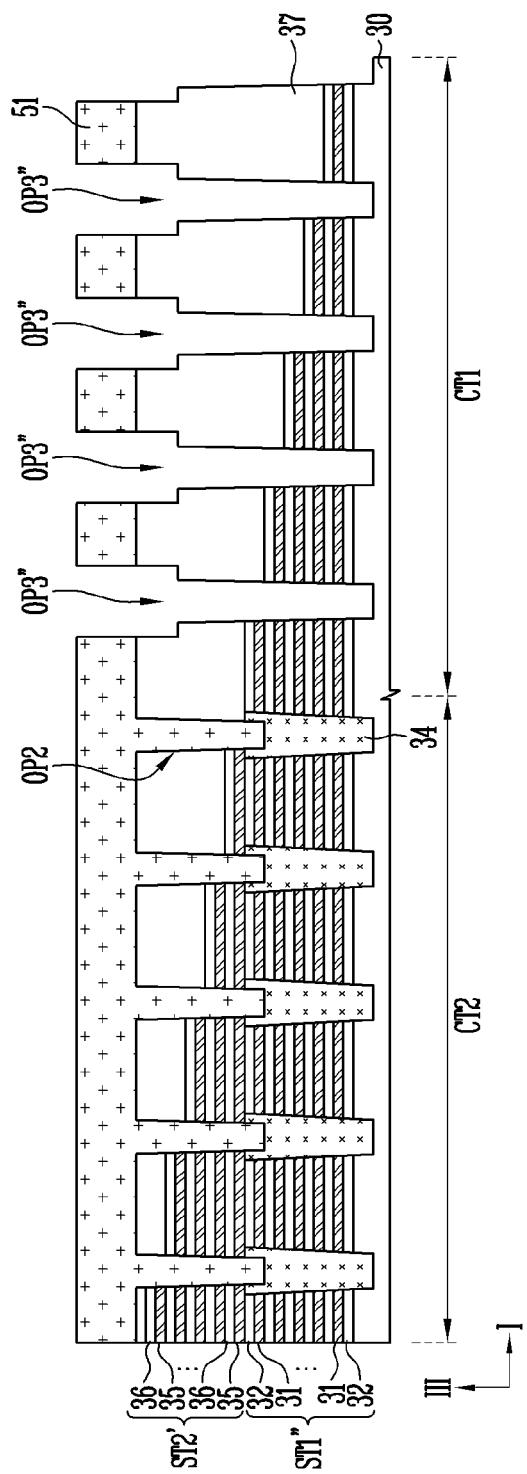

FIGS. 8A, 8B, 9A, and 9B illustrate a manufacturing method of a semiconductor device according to an embodiment of the present disclosure. FIGS. 8A and 9A are plan views, and FIGS. 8B and 9B are cross-sectional views.

Referring to FIGS. 8A and 8B, when second openings OP2 and third openings OP3' are formed using an etch loading difference, one or more of the third openings OP3' may not have a sufficient depth. For example, the third openings OP3' each may penetrate only a portion of a first patterned stack structure ST1'', and fail to expose a top portion of the base 30 as indicated in the dashed circle C. Therefore, an additional etching process for increasing the depth of the third openings OP3' is performed.

Referring to FIGS. 9A and 9B, after the second mask pattern 38 is removed, a third mask pattern 51 is formed. The third mask pattern 51 covers the second openings OP2, and includes openings D exposing the third openings OP3'. Each of the openings D may expose at least one third opening OP3'. For example, one opening D may expose two third openings OP3'. However, embodiments of the present disclosure are not limited thereto, and the number of the third openings OP3' in each of the openings D may vary according to embodiments.

Subsequently, the insulating layer 37 and the first stack structure ST1 are etched using the third mask pattern 51 as an etch barrier. Accordingly, the third openings OP3' extend in a direction from an upper surface of the insulating layer 37 to a lower surface of the insulating layer 37 to form extended third openings OP3'', thereby making each of the extended third openings OP3'' have a sufficient depth to expose a top portion of the base 30.

FIGS. 10A to 10D illustrate a manufacturing method of a semiconductor device according to an embodiment of the present disclosure. Hereinafter, descriptions of contents overlapping with those described above will be omitted.

Figure 10A:
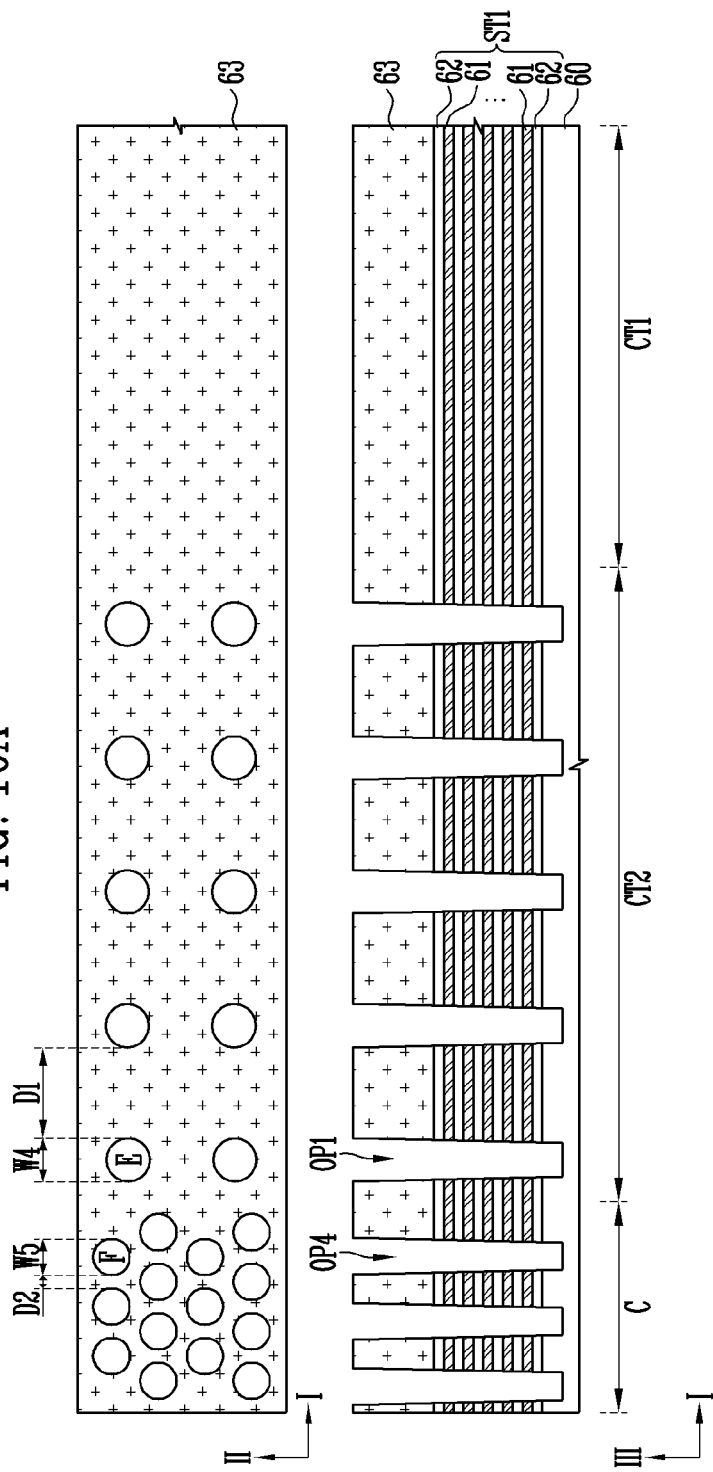
FIGS. 10A, 10B, 10C, and 10D illustrate a manufacturing method of a semiconductor device according to an embodiment of the present disclosure.

Referring to FIG. 10A, a first stack structure ST1 is formed over a base 60. The first stack structure ST1 may include a first portion in a first contact region CT1, a second portion in a second contact region CT2, and a third portion in a cell region C. The second contact region CT2 may be located between the cell region C and the first contact region CT1. The first stack structure ST1 may include first material layers 61 and second material layers 62, which are alternately stacked.

Subsequently, a first mask pattern 63 is formed over the first stack structure ST1. The first mask pattern 63 may be formed to cover the first portion in the first contact region CT1, the second portion in the second contact region CT2, and the third portion in the cell region C. The first mask pattern 63 may include openings F located in the cell region C and openings E located in the second contact region CT2. The openings E and F may be arranged in a first direction I and a second direction II. The openings E may each have a width (e.g., a diameter) W4 greater than a width W5 of the openings F. Adjacent ones of the openings E may be spaced apart from each other by a distance D1 greater than that D2 of the openings F.

Subsequently, first openings OP1 and fourth openings OP4 are formed by etching the first stack structure ST1 using the first mask pattern 63 as an etch barrier. The first openings OP1 may be located in the second contact region CT2, and the fourth openings OP4 may be located in the cell region C. The fourth openings OP4 may be formed when the first openings OP1 are formed. In addition, the first and fourth openings OP1 and OP4 each may be formed to have a sufficient depth to expose a top portion of the base 60.

Figure 10B:
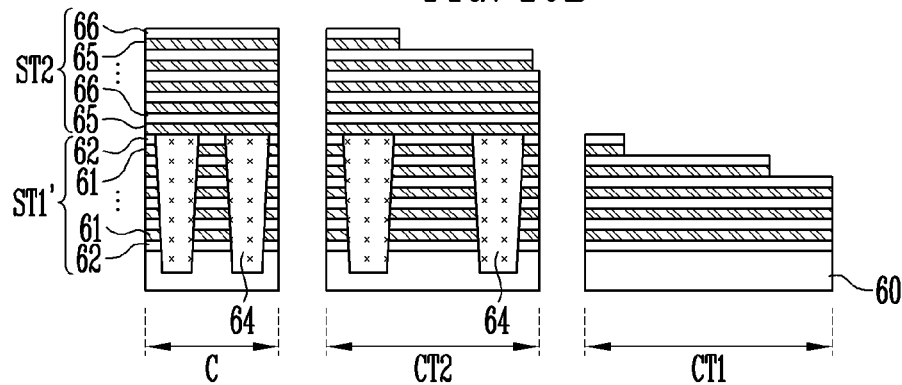

Referring to FIG. 10B, after the first mask pattern 63 is removed, sacrificial patterns 64 are formed in the first and fourth openings OP1 and OP4. Subsequently, a second initial stack structure (not shown) is formed over the first stack structure ST1. The second initial stack structure may include third material layers 65 and fourth material layers 66, which are alternately stacked. Subsequently, the first stack structure ST1 and the second initial stack structure are patterned in a stepped shape to form a first intermediate stack structure ST1' and a second stack structure ST2, respectively. Accordingly, a first portion of the first intermediate stack structure ST1' in the first contact region CT1 and a second portion of the second stack structure ST2 in the second contact region CT2 are patterned in the stepped shape.

Figure 10C:
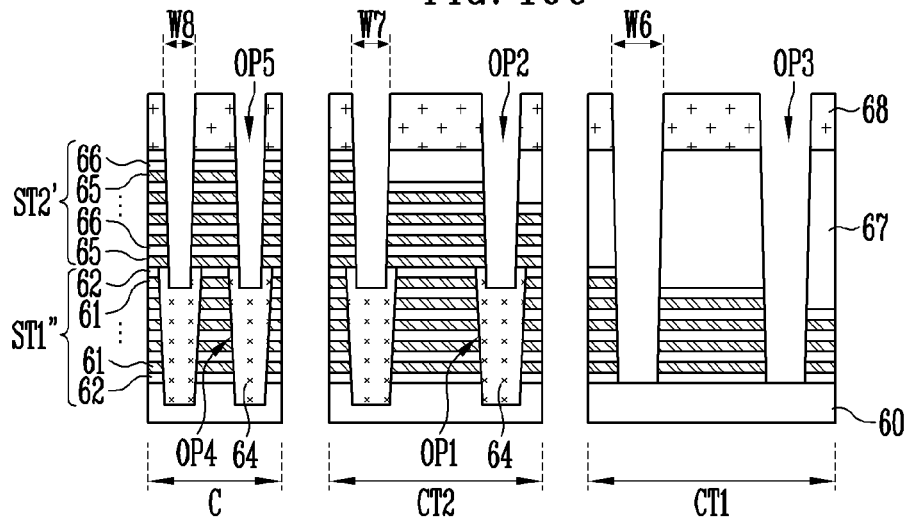

Referring to FIG. 10C, an insulating material layer 67 is formed over the first intermediate stack structure ST1' and the second stack structure ST2. Subsequently, a second mask pattern 68 is formed over the insulating material layer. The second mask pattern 68 may be a photoresist pattern.

Subsequently, the insulating material layer 67, the second stack structure ST2, and the first intermediate stack structure ST1' are etched using the second mask pattern 68 as an etch barrier. Accordingly, second openings OP2 penetrating the insulating material layer 67 and the second patterned stack structure ST2' in the second contact region CT2 are formed. The second openings OP2 may be formed to respectively correspond to the first openings OP1. When the second openings OP2 are formed, third openings OP3 penetrating the insulating material layer 67 and a first patterned stack structure ST1" in the first contact region CT1 are formed. In addition, when the second openings OP2 are formed, fifth openings OP5 penetrating the insulating material layer 67 and the second patterned stack structure ST2' in the cell region C are formed. The fifth openings OP5 may be formed to respectively correspond to the fourth openings OP4.

Each of the third openings OP3 may have a diameter W6 greater than a diameter W7 of each of the second openings OP2, and the diameter W7 of each of the second openings OP2 is substantially equal to or greater than a diameter W8 of each of the fifth openings OP5. The third openings OP3 may have a depth deeper than those of the second openings OP2 and the fifth openings OP5. The second openings OP2 and the fifth openings OP5 each may be formed to have a sufficient depth to expose a top portion of a corresponding one of the sacrificial patterns 64, and the third openings OP3 each may be formed to have a sufficient depth to expose a top portion of the base 60.

Figure 10D:
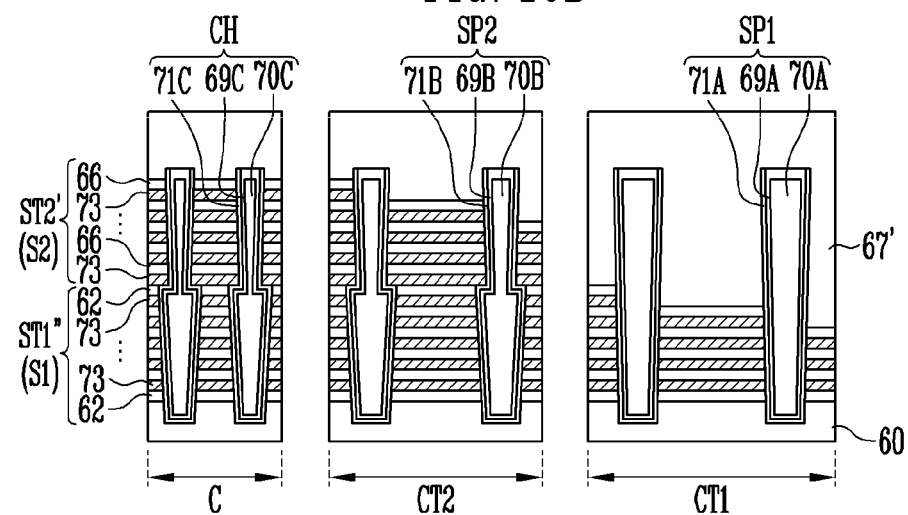

Referring to FIG. 10D, after the second mask pattern 68 is removed, the sacrificial patterns 64 are removed through the second and fifth openings OP2 and OP5. Subsequently, first supporting structures SP1, second supporting structures SP2, and channel structures CH are formed.

The first supporting structures SP1 may be formed in the third openings OP3. The first supporting structures SP1 may penetrate the insulating material layer 67 and a first stepped structure S1 in the first contact region CT1. Each of the first supporting structures SP1 may include a first semiconductor pattern 69A, a first gap fill layer 70A, and a first dielectric layer 71A.

The second supporting structures SP2 may be formed in the first and second openings OP1 and OP2. The second supporting structures SP2 may penetrate the insulating material layer 67 in the second contact region CT2, the second stepped structure S2 in the second contact region CT2, and the first stepped structure S1 in the second contact region CT2. Each of the second supporting structures SP2 may include a second semiconductor pattern 69B, a second gap fill layer 70B, and a second dielectric layer 71B.

The channel structures CH may be formed in the fourth and fifth openings OP4 and OP5. The channel structure CH may penetrate the insulating material layer 67 in the cell region C, the second stepped structure S2 in the cell region C, and the first stepped structure S1 in the cell region C. Each of the channel structures CH may include a channel layer 69C, a gap fill layer 70C, and a memory layer 71C.

For example, a memory layer, a channel layer, and a gap fill layer are sequentially formed over an intermediate resultant structure including the first to fifth openings OP1 to OP5. Subsequently, after the gap fill layer is partially etched, a material included in the channel layer is deposited. Subsequently, a planarization process is performed until an upper surface of the insulating material layer 67 is exposed. Accordingly, the channel structures CH, the first supporting structures SP1, and the second supporting structures SP2 are formed together. Therefore, the first and second semiconductor patterns 69A and 69B may be formed of the same material as the channel layer 69C. In addition, the first and second dielectric layers 71A and 71B may be formed of the same material as the memory layer 71C.

Subsequently, after an insulating material is additionally deposited on the insulating material layer 67 to form an insulating layer 67, the first and third material layers 61 and 65 are replaced with fifth material layers 73. Although not shown in FIG. 10D, in another embodiment, the second and fourth material layers 62 and 66 may be replaced with sixth material layers (not shown).

Although not shown in FIG. 10D, an additional process may be performed depending on the material of the base 60. For example, when the base 60 is a sacrificial layer, an opening is formed by removing the base 60, and the memory layer 71C exposed through the opening is removed. Subsequently, a source layer connected to the channel layer 69C may be formed in the opening.

According to the manufacturing method described above, the first supporting structures SP1 and the second supporting structures SP2 can be formed when the channel structures CH are formed. Further, the channel structures CH and the second supporting structures SP2 can have similar structures, whereas the channel structures CH and the first supporting structure SP1 can have different structures.

Figure 11A:
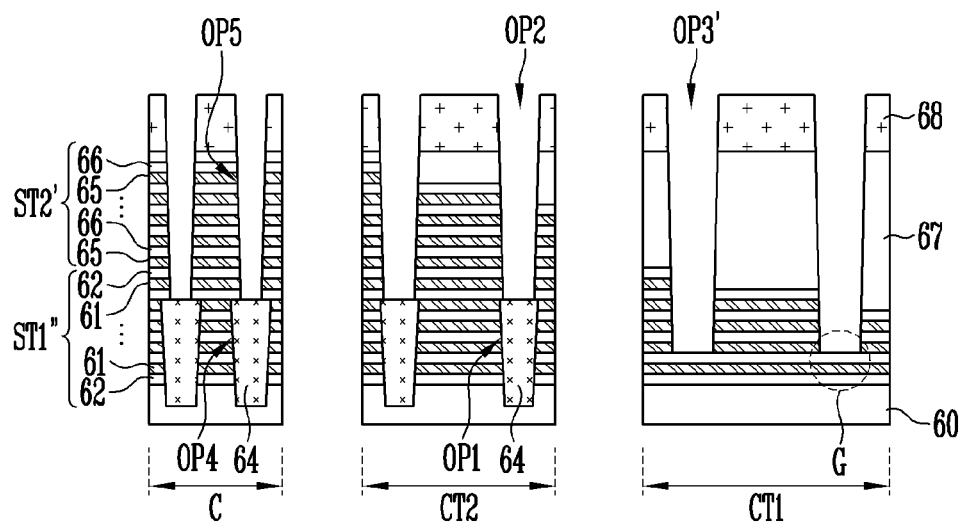
FIGS. 11A and 11B illustrate a manufacturing method of a semiconductor device according to an embodiment of the present disclosure.
Figure 11B:
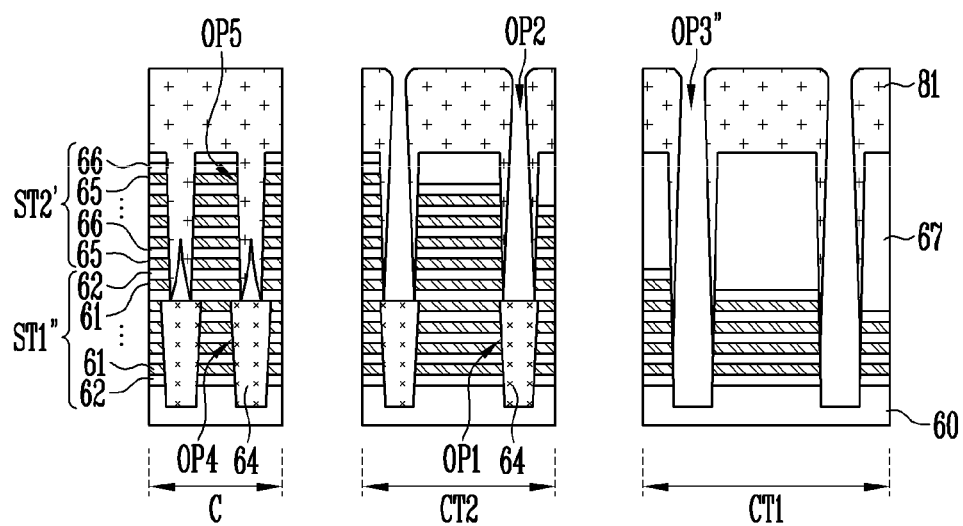

FIGS. 11A and 11B illustrate a manufacturing method of a semiconductor device according to an embodiment of the present disclosure.

Referring to FIG. 10C, when fifth openings OP5, second openings OP2, and third openings OP3 are formed together, one or more of the third openings OP3 may not have a sufficient depth. For example, referring to FIG. 11A, the third openings OP3' each may penetrate only a portion of a first patterned stack structure ST1", and fail to expose a top portion of the base 60 as indicated in the dashed circle G. Therefore, an additional etching process for increasing the depth of the third openings OP3' is performed.

Referring to FIG. 11B, after the second mask pattern 68 is removed, a protective layer 81 is formed. The protective layer 81 may fill the fifth openings OP5, and partially fill the second openings OP2 and the third openings OP3'. The protective layer 81 may be formed using a deposition process. When the second and third openings OP2 and OP3' have diameters greater than that of the fifth openings OP5, due to characteristics of the deposition process, the fifth openings OP5 are substantially completely filled when seen in a top view, whereas the second openings OP2 and the third openings OP3' are partially filled. The protective layer 81 may include amorphous carbon.

Subsequently, the first patterned stack structure ST1" is etched using the protective layer 81 as an etch barrier. Accordingly, the third openings OP3' extend in a direction from an upper surface of the insulating material layer 67 to a lower surface of the insulating material layer 67, thereby making each of the third openings OP3" have a sufficient depth to expose a top portion of the base 60.

Figure 12:
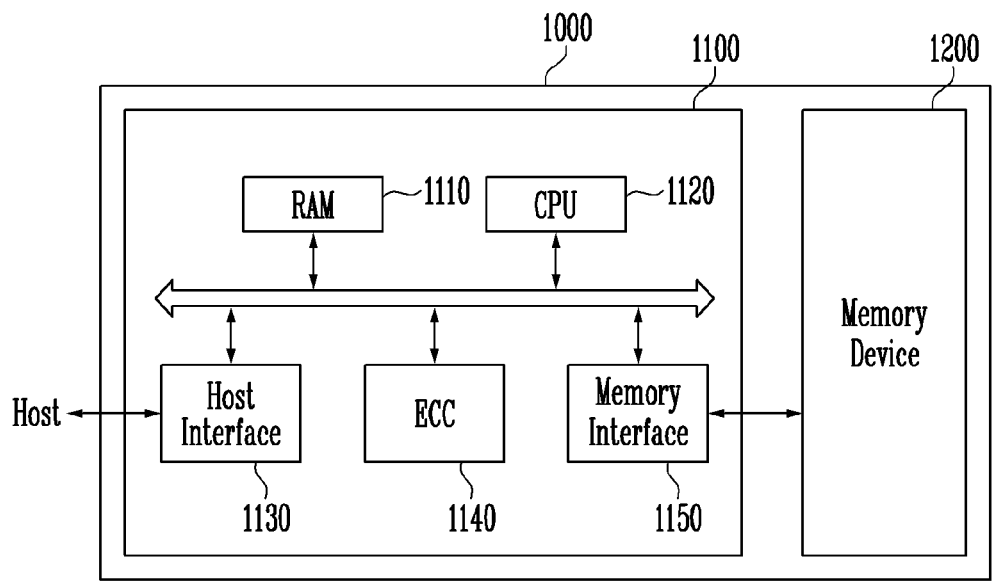
FIGS. 12 and 13 are block diagrams illustrating configurations of memory systems in accordance with embodiments of the present disclosure.

FIG. 12 is a block diagram illustrating a configuration of a memory system in accordance with an embodiment of the present disclosure.

Referring to FIG. 12, the memory system 1000 in accordance with the embodiment of the present disclosure includes a memory device 1200 and a controller 1100.

The memory device 1200 is used to store data information having various data formats such as texts, graphics, and software codes. The memory device 1200 may be a nonvolatile memory. Also, the memory device 1200 may have the structures described with reference to FIGS. 1A to 11B, and be manufactured according to the manufacturing methods described with reference to FIGS. 1A to 11B. In an embodiment, the memory device 1200 may include: a first stepped structure including a first contact region and a second contact region; a second stepped structure located on the second contact region of the first stepped structure, the second stepped structure exposing the first contact region; a first supporting structure penetrating the first contact region of the first stepped structure, the first supporting structure including a sidewall having a constant slope; and a second supporting structure penetrating the second contact region of the first stepped structure and the second stepped structure, the second supporting structure including a sidewall of which the slope has at least one inflection point. The structure and manufacturing method of the memory device 1200 are the same as described above, and therefore, their detailed descriptions will be omitted.

The controller 1100 is connected to a host and the memory device 1200, and is configured to access the memory device 1200 in response to a request from the host. For example, the controller 1100 is configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. The RAM 1110 may be replaced with a static random access memory (SRAM), a read only memory (ROM), etc.

The CPU 1120 is configured to control overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

The controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with the embodiment of the present disclosure includes the memory device 1200 having an improved degree of integration and improved characteristics, and thus the degree of integration and characteristics of the memory system 1000 can be improved.

Figure 13:
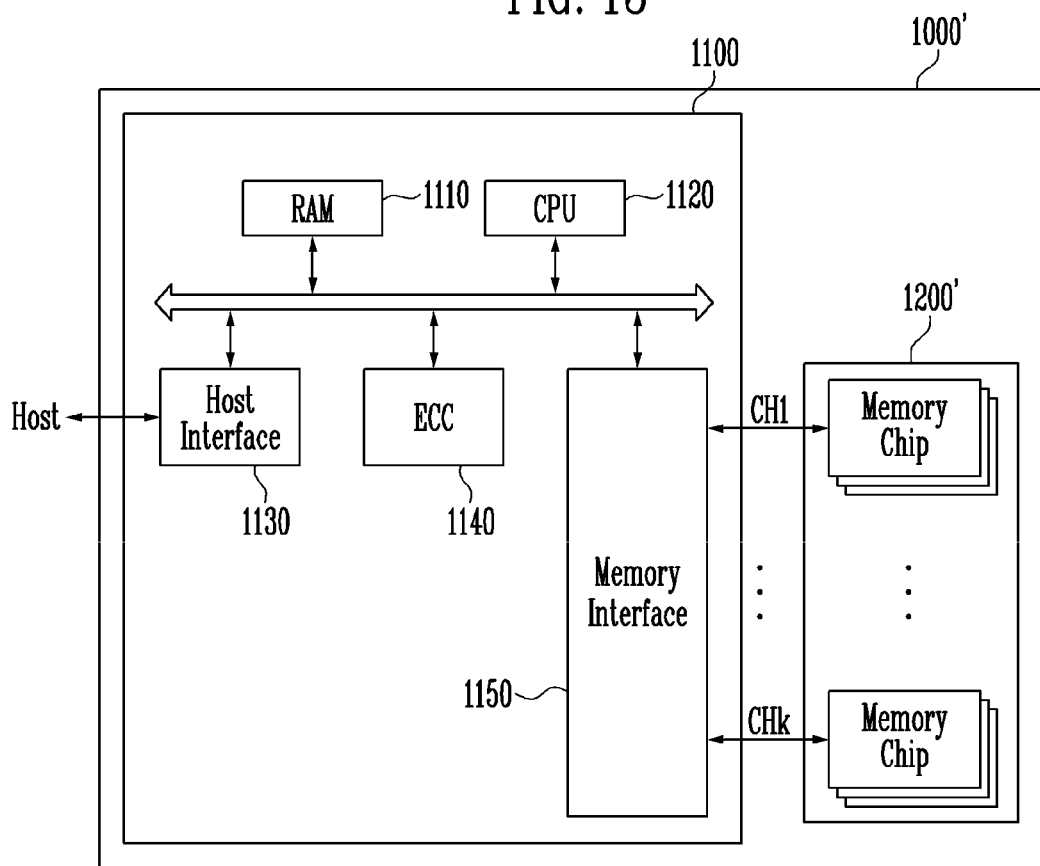

FIG. 13 is a block diagram illustrating a configuration of a memory system in accordance with an embodiment of the present disclosure. Hereinafter, descriptions of contents overlapping with those described above will be omitted.

Referring to FIG. 13, the memory system 1000' in accordance with the embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. Also, the memory device 1200' may have the structures described with reference to FIGS. 1A to 11B, and be manufactured according to the manufacturing methods described with reference to FIGS. 1A to 11B. In an embodiment, the memory device 1200' may include: a first stepped structure including a first contact region and a second contact region; a second stepped structure located on the second contact region of the first stepped structure, the second stepped structure exposing the first contact region; a first supporting structure penetrating the first contact region of the first stepped structure, the first supporting structure including a sidewall having a constant slope; and a second supporting structure penetrating the second contact region of the first stepped structure and the second stepped structure, the second supporting structure including a sidewall of which the slope has at least one inflection point. The structure and manufacturing method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' in accordance with the embodiment of the present disclosure includes the memory device 1200' having an improved degree of integration and improved characteristics, and thus the degree of integration and characteristics of the memory system 1000' can be improved. Particularly, the memory device 1200' is configured as a multi-chip package, so that the data storage capacity of the memory system 1000' can be increased, and the operation speed of the memory system 1000' can be improved.

Figure 14:
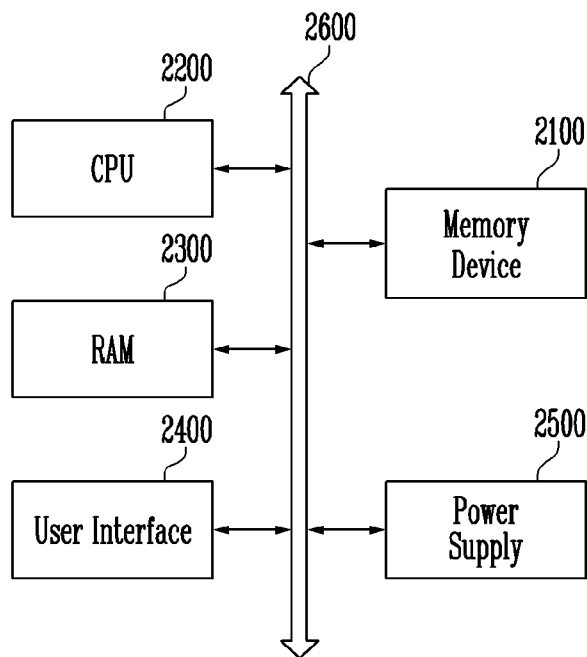
FIGS. 14 and 15 are block diagrams illustrating configurations of computing systems in accordance with embodiments of the present disclosure.

FIG. 14 is a block diagram illustrating a configuration of a computing system in accordance with an embodiment of the present disclosure. Hereinafter, description of contents overlapping with those described above will be omitted.

Referring to FIG. 14, the computing system 2000 in accordance with the embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

The memory device 2100 may be a nonvolatile memory. Also, the memory device 2100 may have the structures described with reference to FIGS. 1A to 11B, and be manufactured according to the manufacturing methods described with reference to FIGS. 1A to 11B. In an embodiment, the memory device 2100 may include: a first stepped structure including a first contact region and a second contact region; a second stepped structure located on the second contact region of the first stepped structure, the second stepped structure exposing the first contact region; a first supporting structure penetrating the first contact region of the first stepped structure, the first supporting structure including a sidewall having a constant slope; and a second supporting structure penetrating the second contact region of the first stepped structure and the second stepped structure, the second supporting structure including a sidewall of which the slope has at least one inflection point. The structure and manufacturing method of the memory device 2100 are the same as described above, and therefore, their detailed descriptions will be omitted.

The memory device 2100 may be a multi-chip package including a plurality of memory chips as described with reference to FIG. 13.

The computing system 2000 configured as described above may be a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 in accordance with the embodiment of the present disclosure includes the memory device 2100 having an improved degree of integration and improved characteristics, and thus characteristics of the computing system 2000 can also be improved.

Figure 15:
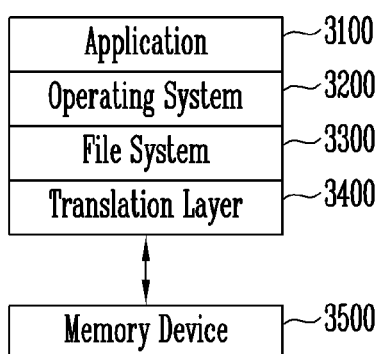

FIG. 15 is a block diagram illustrating a computing system in accordance with an embodiment of the present disclosure.

Referring to FIG. 15, the computing system 3000 in accordance with the embodiment of the present disclosure includes a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. Also, the memory device 3500 may have the structures described with reference to FIGS. 1A to 11B, and be manufactured according to the manufacturing methods described with reference to FIGS. 1A to 11B. In an embodiment, the memory device 3500 may include: a first stepped structure including a first contact region and a second contact region; a second stepped structure located on the second contact region of the first stepped structure, the second stepped structure exposing the first contact region; a first supporting structure penetrating the first contact region of the first stepped structure, the first supporting structure including a sidewall having a constant slope; and a second supporting structure penetrating the second contact region of the first stepped structure and the second stepped structure, the second supporting structure including a sidewall of which the slope has at least one inflection point. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. The application 3100, the operating system 3200, and the file system 3300 are included in the operating system layer, and may be driven by a working memory of the computing system 3000. In addition, the translation layer 3400 may be included in the operating system layer or the controller layer.

As described above, the computing system 3000 in accordance with the embodiment of the present disclosure includes the memory device 3500 having an improved degree of integration and improved characteristics, and thus characteristics of the computing system 3000 can also be improved.

In accordance with the present disclosure, there can be provided a semiconductor device having a stable structure and improved reliability. Further, when the semiconductor device is manufactured, the level of difficulty of processes can be lowered, manufacturing procedures can be simplified, and manufacturing cost can be reduced.

The exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A method of manufacturing a semiconductor device, the method comprising:
    forming a first patterned stack structure including a cell region, a first portion in a first contact region, and a second portion in a second contact region, the second portion of the first patterned stack structure including a first opening;
    forming a second patterned stack structure including a third portion over the cell region and the second contact region of the first patterned stack structure;
    forming a second opening penetrating the third portion of the second patterned stack structure, the second opening being coupled to the first opening; and
    forming a third opening penetrating the first portion of the first patterned stack structure when the second opening is formed,
    wherein a diameter of a top of the third opening is greater than a diameter of a top of the second opening.

2. The method of claim 1, further comprising:
    forming a sacrificial pattern in the first opening;
    removing the sacrificial pattern, after the second opening and the third opening are formed; and
    forming a first supporting structure in the third opening; and
    forming a second supporting structure in the first and second openings when the first supporting structure is formed.

3. The method of claim 1, further comprising:
    forming a first plug in the first opening;
    forming a second plug coupled to the first plug in the second opening; and
    forming a first supporting structure in the third opening when the second plug is formed.

4. The method of claim 1, further comprising:
    forming a first stack structure;
    forming a second initial stack structure over the first stack structure; and
    patterning the second initial stack structure and the first stack structure to form a second stack structure and a first intermediate stack structure, respectively, before the second opening is formed,
    wherein the first intermediate stack structure has a first stepped shape and the second stack structure has a second stepped shape.

5. The method of claim 4, wherein the first intermediate stack structure in the first contact region has the first stepped shape, and the second stack structure in the second contact region has the second stepped shape.

6. The method of claim 1, wherein the third opening has a depth deeper than that of the second opening.

7. The method of claim 4, further comprising forming an insulating layer over the second stack structure,
    wherein the second opening penetrates the insulating layer and the third portion of the second patterned stack structure, and the third opening penetrates the insulating layer and the first portion of the first patterned stack structure.

8. The method of claim 1, further comprising:
    forming a mask pattern over the second patterned stack structure, the mask pattern covering the second opening and exposing the third opening, after the second and third openings are formed; and
    etching the first patterned stack structure, using the mask pattern as an etch barrier until the third opening reaches or extends beyond a lower surface of the first patterned stack structure.

9. The method of claim 1, further comprising:
    forming a fourth opening penetrating a first stack structure in the cell region when the first opening is formed; and
    forming a fifth opening penetrating the second patterned stack structure in the cell region when the second and third openings are formed, the fifth opening being coupled to the fourth opening.

10. The method of claim 9, wherein the first opening has a diameter greater than that of the fourth opening.

11. The method of claim 9, wherein the second opening has a first diameter and the third opening has a second diameter, and each of the first and second diameters is greater than that of the fifth opening.

12. The method of claim 9, further comprising forming a channel structure in the fourth and fifth openings.

13. The method of claim 12, further comprising forming a first supporting structure in the third opening and a second supporting structure in the first and second openings, when the channel structure is formed in the fourth and fifth openings.

14. The method of claim 9, further comprising:
    forming a protective layer filling the fifth opening, the protective layer exposing the third opening; and
    etching the first patterned stack structure using the protective layer as an etch barrier until the third opening reaches or extends beyond a lower surface of the first patterned stack structure.

15. The method of claim 14, wherein the protective layer includes amorphous carbon.

16. The method of claim 1, further comprising forming a sacrificial pattern in the first opening,
    wherein the second opening is formed to have a sufficient depth to expose a top portion of the sacrificial pattern.

* * * * *